United States Patent [19]
Kwon et al.

[11] Patent Number: 5,841,721
[45] Date of Patent: Nov. 24, 1998

[54] MULTI-BLOCK ERASE AND VERIFICATION CIRCUIT IN A NONVOLATILE SEMICONDUCTOR MEMORY DEVICE AND A METHOD THEREOF

[75] Inventors: Seok-Chun Kwon; Jin-Ki Kim, both of Seoul, Rep. of Korea

[73] Assignee: Samsung Electronics Co., Ltd, Kyungki-Do, Rep. of Korea

[21] Appl. No.: 975,704

[22] Filed: Nov. 21, 1997

Related U.S. Application Data

[62] Division of Ser. No. 523,612, Sep. 5, 1995.

[30] Foreign Application Priority Data

Sep. 3, 1994 [KR] Rep. of Korea ............... 1994-22167

[51] Int. Cl.$^6$ ..................................... G11C 13/00
[52] U.S. Cl. ..................... 365/218; 364/185.33
[58] Field of Search ................. 365/218, 185.33

[56] References Cited

U.S. PATENT DOCUMENTS 5,065,364  11/1991  Atwood ................ 365/185.33

*Primary Examiner*—Terrell W. Fears
*Attorney, Agent, or Firm*—Cushman Darby&Cushman IP Group of Pillsbury Madison & Sutro LLP

[57] ABSTRACT

A multi-block erase circuit in nonvolatile semiconductor memory device comprises a plurality of memory blocks composed of a plurality of memory cells formed on a semiconductor substrate, each memory cell composed of at least one memory transistor with a floating gate and a control gate, and a plurality of block selectors connected to the memory blocks to select the control gates of the memory transistors within a selected memory block and to erase the memory transistors during an erase operation, wherein each block selector has storing means for storing block selection flags to select the control gates of the memory transistors within at least one selected memory block during the erase operation and for storing reset flags to float the control gates of the memory transistors within the remaining unselected memory blocks, thereby erasing simultaneously only the memory transistors within the selected memory blocks during the erase operation.

7 Claims, 18 Drawing Sheets

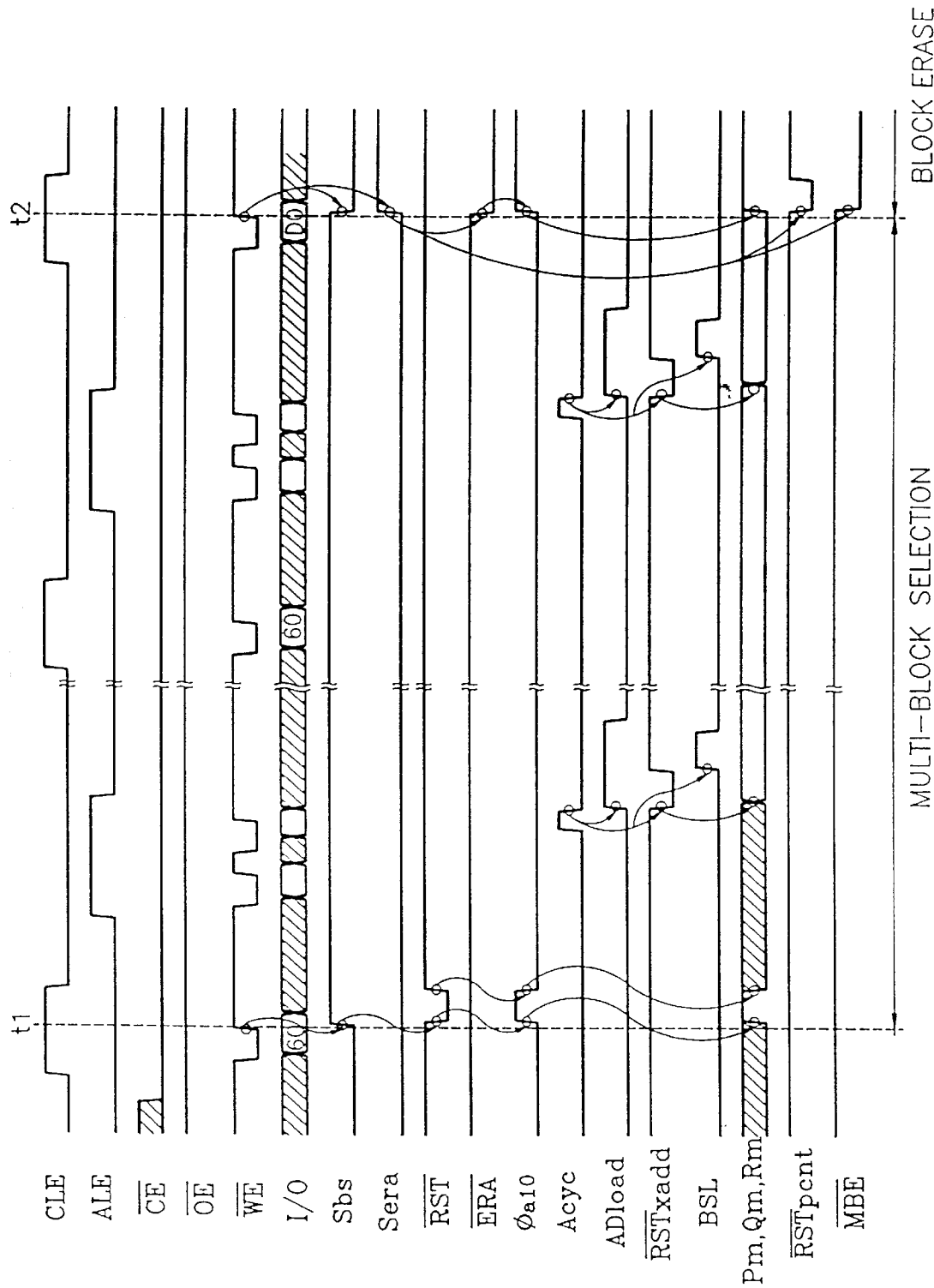

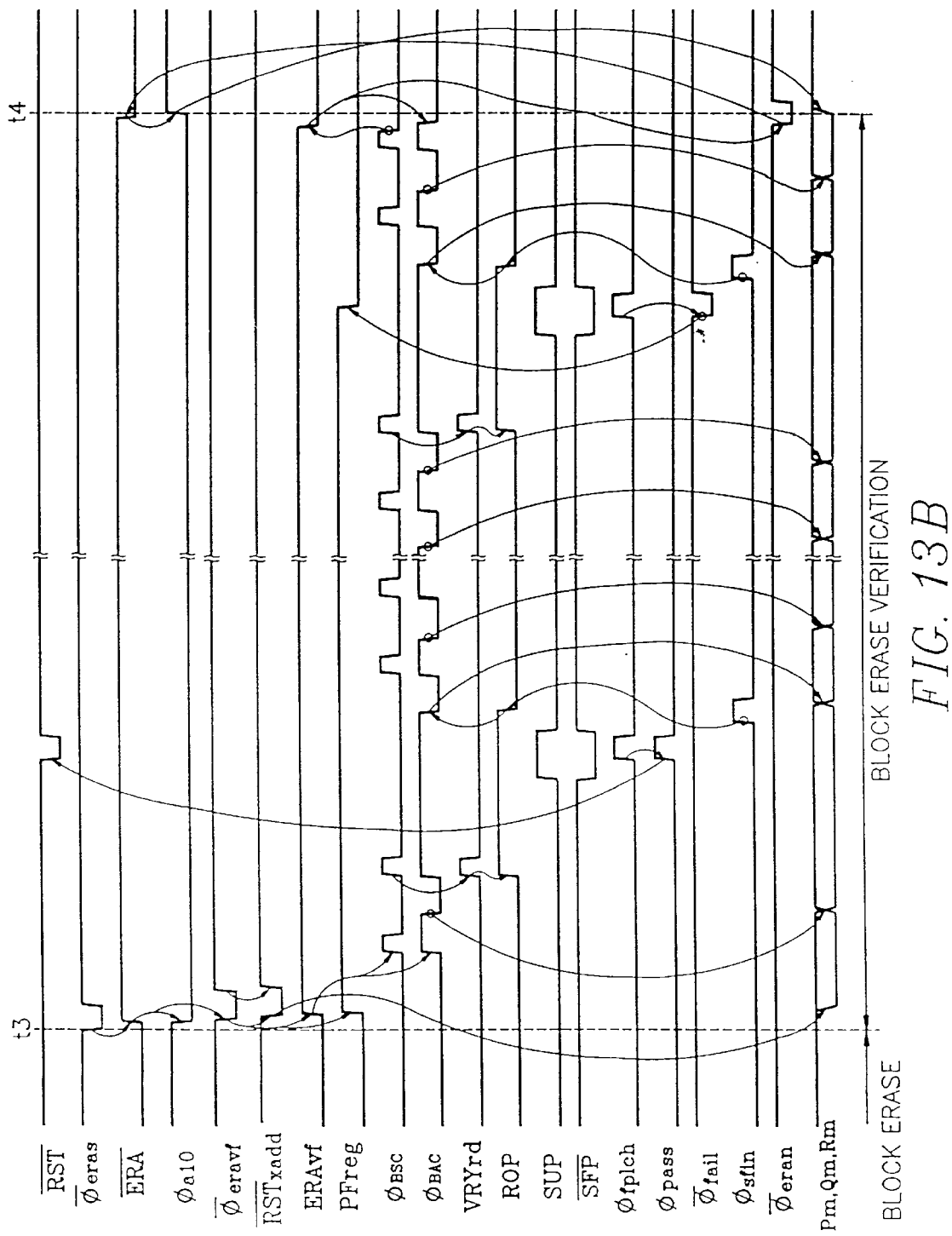

MULTI-BLOCK ERASE AND VERIFICATION CIRCUIT IN A NONVOLATILE SEMICONDUCTOR MEMORY DEVICE AND A METHOD THEREOF

This application is a Division of Ser. No. 08/523,612 filed Sep. 5, 1995.

BACKGROUND OF THE INVENTION

1. Field of the Invention

The present invention relates to a block erase and verification circuit in a nonvolatile semiconductor memory device and a method thereof.

2. Description of the Related Arts

In order to realize an electrically erasable and programmable nonvolatile semiconductor memory device (hereinafter referred to as an "EEPROM") of high density, the EEPROM with NAND structured cells capable of reducing the number of the selection transistors per cell and the number of the contact holes connected to bit lines has been developed. Such a NAND structured cell (hereinafter referred to as a "NAND cell") comprises a first selection transistor, a second selection transistor being connected to a common source line and having its source connected to a ground, and a plurality of floating gate type memory transistors having their channels serially connected between a source of the first selection transistor and a drain of the second selection transistor. A plurality of NAND cells are arranged in a matrix form of rows and columns. The drains of the first selection transistors are respectively connected to the corresponding bit lines in the row direction. The gates of the first selection transistors, control gates of the memory transistors and gates of the second transistors arranged in the same columns are respectively connected to the corresponding first selection lines, corresponding word lines and corresponding second selection lines, thus forming a memory cell array. The memory cell array is formed in a P type well region formed on an N type semiconductor substrate. The NAND cells arranged in the same columns represent respective memory blocks.

In order to change data of the programmed EEPROM, the data of all memory transistors within the EEPROM should be erased first and reprogrammed next. However, data should be reprogrammed after all transistors are erased even when only some of the data are required to be changed. Thus, as the memory capacity of the EEPROM increases, such a problem of inconvenience and longer erase time becomes more serious. To solve such a problem, techniques for reprogramming after selectively erasing only the memory blocks having data to be changed have been developed. Such a technique is disclosed in the Korean patent application No. 93-390 filed by the applicant of the present invention. The block erasing technique disclosed therein is for applying high erase voltage to the P type well region and at the same time ground voltage of 0 volt to the word lines of the selected memory block and for floating the word lines of the unselected memory blocks. Then, the memory transistors within the selected memory block emit electrons from the floating gates thereof by the Fowler-Nordheim tunneling, thus having a negative threshold voltage, i.e., −3 V. Such an erase state will be referred to as the erase state of data "1". On the other hand, since the word lines within the unselected memory blocks are in a floating state, the erase voltage applied to the P type well region is charged to the word lines by the capacitance coupling, thereby preventing the erase. That is, the self-erase prevention of the unselected memory blocks can be implemented without the use of separate circuits.

However, such a block erase method has a problem that the memory blocks to be erased are selectively erased one by one. This reqires longer time and consequently deteriorates the performance of the EEPROM. Therefore, a technique for erasing simultaneously the selected memory blocks is required.

At the erasing the memory transistors within the selected memory blocks, if the threshold voltage of the memory transistor does not reach a predetermined level due to the change of the thickness of the tunnel oxide films of the memory transistors, the change of the operational conditions, such as the change of the power supply voltage and temperature, and the increase of the frequency of erasing the memory transistors, the reliability of the EEPROM may be deteriorated. Therefore, the erase verification operation for the erased memory transistors are required to reach a predetermined threshold voltage level.

SUMMARY OF THE INVENTION

It is therefore an object of the present invention to provide an electrically erasable and programmable nonvolatile semiconductor memory device capable of enhancing the performance thereof.

It is another object of the present invention to provide the electrically erasable and programmable nonvolatile semiconductor memory device capable of erasing simultaneously a plurality of memory blocks in which data to be changed are written.

It is still another object of the present invention to provide the electrically erasable and programmable nonvolatile semiconductor memory device capable of enhancing the reliability thereof.

To achieve the above objects of the present invention, there is provided the nonvolatile semiconductor memory device having a plurality of memory blocks composed of a plurality of memory cells formed on a semiconductor substrate, each memory cell composed of at least one memory transistor with a floating gate and a control gate, and having a plurality of block selectors connected to the memory blocks in order to select the control gates of the memory transistors within a selected memory block and to erase the memory cells during an erase operation. The block selectors respectively comprise storing means for storing block selection flags to select the control gates of the memory transistors within at least one selected memory block and for storing reset flags to float the control gates of the memory transistors within the remaining unselected memory blocks, thereby enabling to erase simultaneously the memory transistors within the selected memory blocks during the erase operation. In addition, the block selectors have judging means for generating an erase verify read signal when the block selection flag is stored at the storing means corresponding to the selected memory block, thus performing the erase verification operation only for the memory block corresponding to the block selector generating the erase verify read signal. When the memory transistors within the selected memory block are successfully erased, the block selection flag stored at the corresponding storing means is changed to the reset flag. The block selectors also have control means for repeating the block erase and erase verification operations until all the memory transistors within the selected memory block are successfully erased.

BRIEF DESCRIPTION OF THE DRAWINGS

In the detailed description of the preferred embodiments of the present invention presented below, reference is made to the accompanying drawings, in which:

FIGS. 13A to 13E are timing diagrams according to the present invention.

DETAILED DESCRIPTION OF THE PREFERRED EMBODIMENT

Figure 1:
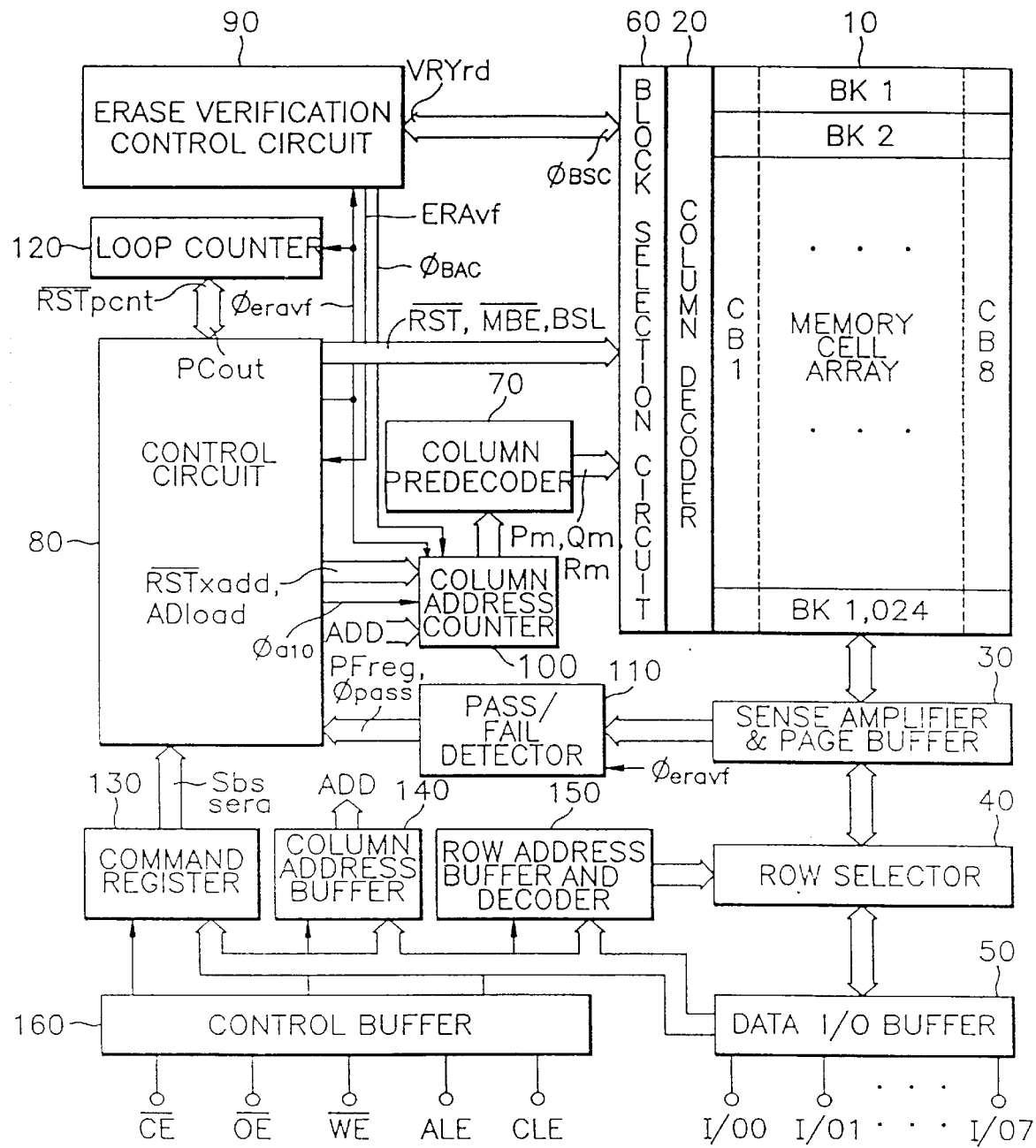
FIG. 1 is a schematic block diagram according to the present invention.

Like reference numerals designate identical or corresponding parts throughout the views wherein the character i represents the ith memory block and the character k represents the kth row block.

In the following descriptions, specific details such as the number of the memory cells and NAND cells, the number of the bit lines, the voltage value, the circuit configuration and components, are provided for an overall understanding of the present invention. It can be predicted by those skilled in the art that the present invention can be implemented without these specific details.

The EEPROM of the present invention is made by utilizing a CMOS manufacturing technique, and employs depression mode N-channel MOS transistors (hereinafter referred to as D type transistors) with the threshold voltage of -2 to -3 V, enhancement mode N-channel MOS transistors (hereinafter referred to as N-channel transistors) with the threshold voltage of around 0.7 V, and P-channel MOS transistors (hereinafter referred to as P-channel transistors) having the threshold voltage of around -0.9 V.

FIG. 1 is a schematic block diagram illustrating a preferred embodiment of the present invention. In the figure, the memory capacity of a memory cell array 10 is 32 Mb. The memory cell array 10 is composed of a plurality of NAND cells arranged in a matrix form of 1,024 columns and 2,048 rows, and is divided into 1,024 memory blocks $BK_1$ to $BK_{1,024}$ in the column direction. In addition, 2,048 rows of the memory cell array are divided into 8 row blocks CBk (k=1, 2, ... 8), with each row block having 256 rows. The row blocks CBk are respectively connected to the external data I/O terminals I/O0, I/O1, ..., I/O7.

Each of the memory blocks BKi(i=1, 2, ... 1,024) is composed of the NAND cells arranged in two adjacent columns.

Figure 2:
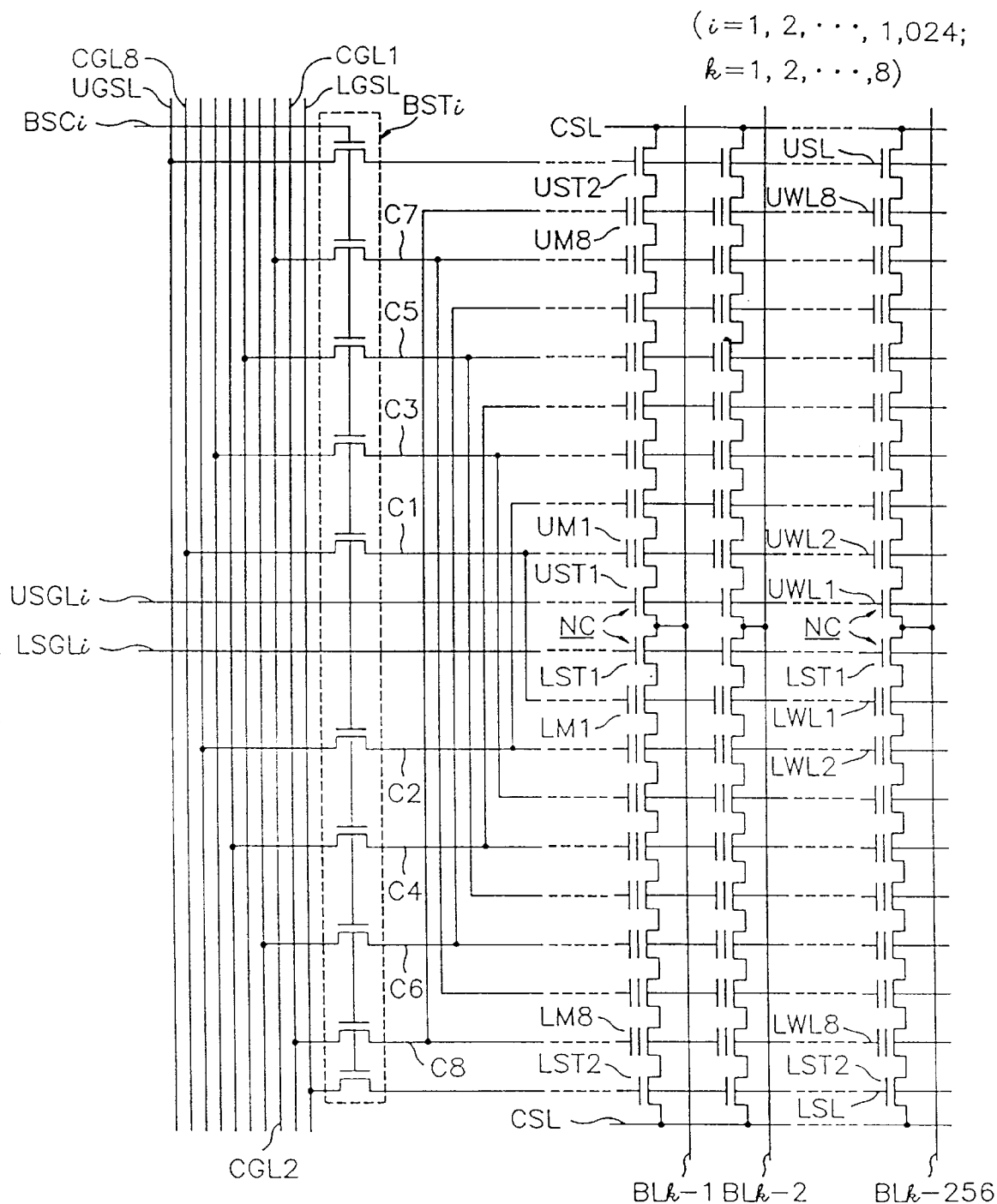
FIG. 2 is a schematic circuit diagram showing the arrangements of shared word lines of the ith memory block and of the memory cells of the kth row block according to the present invention.

FIG. 2 shows the memory cell array in the kth row block CBk of the ith memory block BKi. Referring to FIG. 2, each NAND cell NC comprises lower(upper) memory transistors LM1 to LM8(UM1 to UM8) having drain-source channels serially connected between the source of a lower(upper) first selection transistor LST1(UST1) and the drain of a lower (upper) second selection transistor LST2(UST2). The drains of the lower and upper first selection transistors LST1 and USTI are connected to the corresponding bit lines BLk-1 to BLk-256, and the sources of the second selection transistors are connected to a reference potential, i.e., to the ground through common source lines CSL. The lower word lines LWL1 to LWL8 coupled to the control gates of the lower memory transistors LM1 to LM8 are commonly connected to the upper word lines UWL1 to UWL8 coupled to the control gates of the upper memory transistors UM1 to UM8. The gates of the lower and upper second selection transistors are respectively connected to the lower and upper second selection lines LSL and USL. The shared word lines C1 to C8 and the lower and upper second selection lines LSL and USL are respectively connected to the control gate lines CGL1 to CGL8 and the lower and upper ground selection lines LGSL and UGSL through the channels of the block selection transfer gates BSTi. The gates of the lower and upper first selection transistors LST1 and UST1 are respectively connected to the lower and upper selection gate lines LSGLi and USGLi. The gates of the block selection transfer gates BSTi are coupled to the block selection control lines BSCi.

Figure 3:
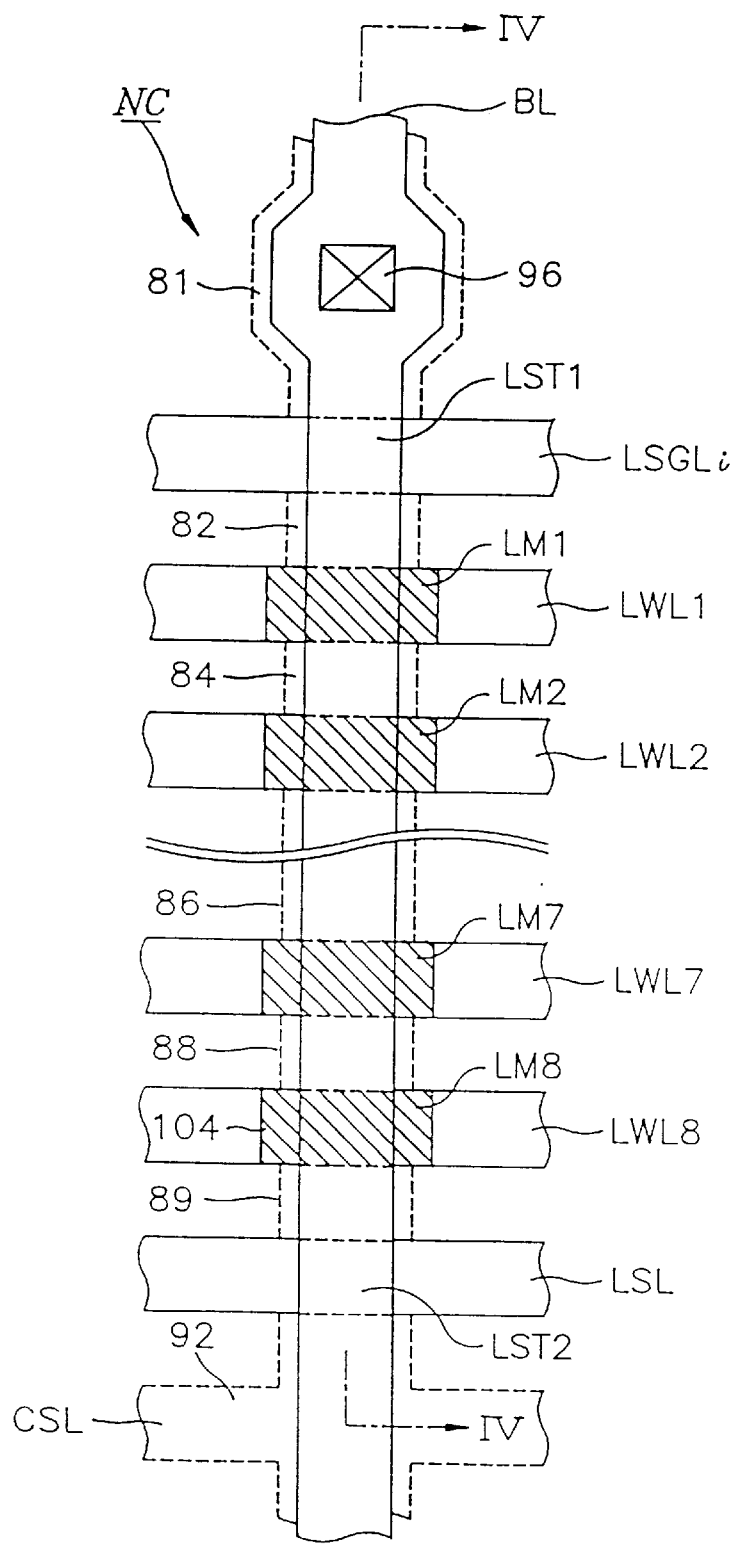
FIG. 3 is a layout of a NAND cell according to the present invention.
Figure 4:
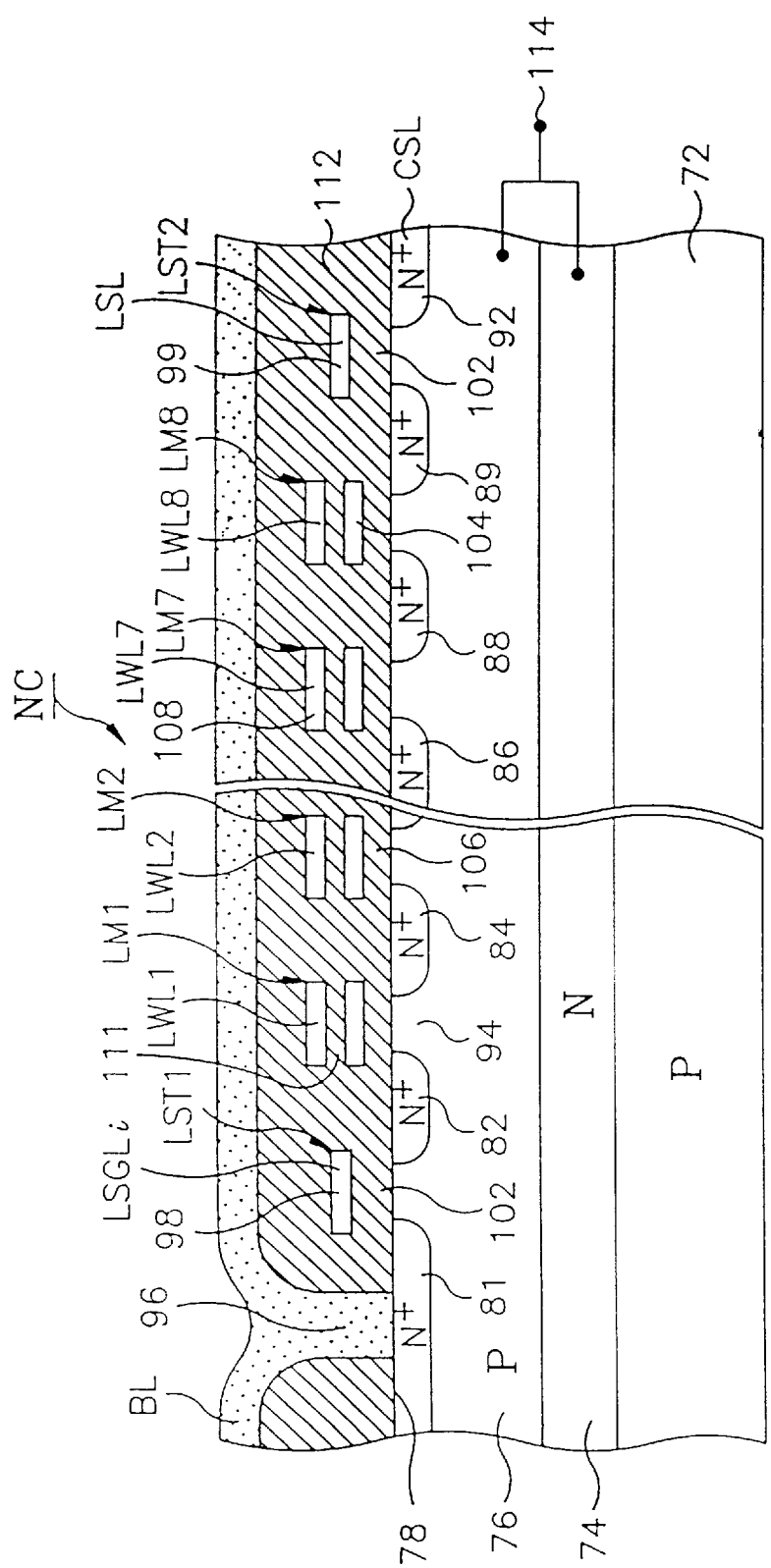
FIG. 4 is a sectional view taken along a line IV—IV of FIG. 3.

The memory cell array 10 is formed in a P type well region formed on a semiconductor substrate. FIGS. 3 and 4 respectively illustrate a plan view and a cross sectional view of one of the lower NAND cells in the memory cell array 10.

Referring to FIGS. 3 and 4, a semiconductor substrate 72 is a P type silicon semiconductor substrate having crystal surface of 100 and impurity concentration of $7 \times 10^{14}/cm^3$. The P type well region 76 having the impurity concentration of around $2 \times 10^{16}/cm^3$ is formed as thick as 4 μm from the main surface 78 of the semiconductor substrate 72. The P type well region 76 is surrounded by an N type well region 74 having the depth of 10 μm and the impurity concentration of around $5 \times 10^{15}/cm^3$. The $N^+$ regions 81 to 92 doped with N type impurities of high density are formed within the P type well region 76 and are isolated one another by placing the channel regions 94 therebetween on the main surface 78. The $N^+$ region 81 functions as a contact region connected to the bit line BL made of metal like aluminum through a contact hole 96 and as a drain region of the lower first selection transistor LST1. The $N^+$ regions 82 to 89 function as common source-drain regions of two adjacent transistors of the transistors LST1, LM1 to LM8, and LST2. The $N^+$ region 92 functions as a source region of the lower second selection transistor LST2 and as a buried common source line CSL. The common source line CSL may be a conductive layer ohmic-contacted to the $N^+$ region 92 through the contact hole and buried in an insulating layer 112. The gate films 98 and 99 made of metal silicide materials with high fusing point like tungsten silicide of 1500 Å thick are formed on the upper parts of the channel regions of the lower first and second selection transistors LST1 and LST2, with gate insulating films 102 of 300 Å thick being placed between the gate films 98 and 99 and the main surface 78.

Floating gates 104 made of polycrystalline silicon material with the thickness of 1500 Å are formed on the upper part of the channel regions 94 of the memory transistors LM1 to LM8, with gate insulating films 106 of 100 Å thick being placed between the channel regions 94 and the floating gates 104. The control gates 108 made of metal silicide material of high fusing point with the thickness of 1500 Å are formed on the floating gates 104, with ONO insulating film of $SiO_2$—$Si_3N_4$—$SiO_2$ being placed between the control gates 108 and the floating gates 104. The gates 98 and 99 of the lower first and second selection transistors LST1 and LST2 and the control gates 108 of the memory transistors LM1 to LM8 are respectively connected to the lower selection gate line LSGLi, lower second selection line LSL and lower word lines LWL1 to LWL8 made of the same material as that used in the gates 98, 99 and 108. The gates 98 and 99, control gates 108, floating gates 104, first and second selection lines SL1 and SL2 and word lines WL1 to WL8 are insulated one another by the insulating layer 112 made of insulating material, such as BPSG, PSG or silicon oxide.

The bit line BL connected to the contact region 81 through the contact hole 96 is extended in the row direction on the insulating layer 112. The P type well region 76 and N type well region 74 are commonly connected to a well electrode 114 through the contact holes (not shown). The memory cell array 10 according to the present invention may be formed in the P type well region formed on the N type semiconductor substrate.

Figure 5:
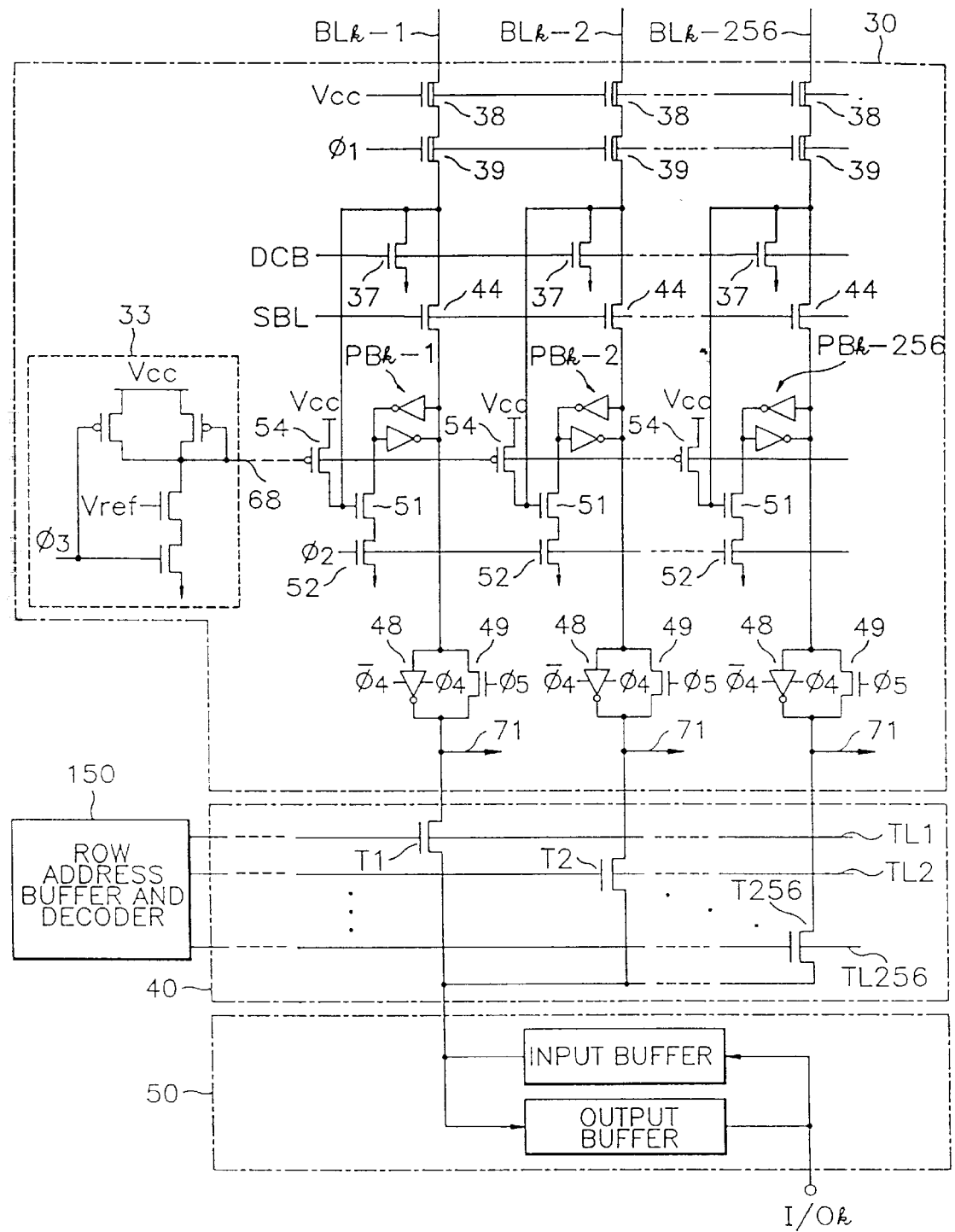
FIG. 5 is a schematic circuit diagram illustrating the sense amplifier and page buffer and the row selector connected to the bit lines of the kth row block of FIG. 2.

Returning to FIG. 1, the bit lines of the memory cell array 10 are connected to the sense amplifier and page buffer 30. For the convenience of illustration, FIG. 5 shows a schematic circuit diagram of the sense amplifier and page buffer 30, row selector 40 and data I/O buffer 50 related to the ith row block CBk within the memory cell array 10. In the figure, the components composed of a reference part 33 and P type transistors 54 represent a current mirror type sense amplifier, and the bit lines are connected to the page buffers PBk-1 to PBk-256. The constructions and operations of the sense amplifier and page buffer 30, row selector 40 and data I/O buffer 50 are equal to those in U.S. patent application Ser. No. 08/171,300, and which is incorporated into the present invention.

A column decoder 20 of FIG. 1 functions to apply word line driving signals corresponding to respective operation modes to the control gate lines $CGL_1$ to $CGL_8$ of FIG. 2 and is disclosed in the above-referenced Korean patent application No. 93-390. In the block erase and erase verification modes, the reference voltage of 0 V is applied to the control gate lines $CGL_1$ to $CG_8$. The lower and upper ground selection lines LGSL and UGSL are connected to a ground line driving circuit (not shown), and in the multi-block erase and erase verification modes, the voltage of about 5 V is applied to the lower and upper ground selection lines LGSL and UGSL.

A block selector 60 of FIG. 1 functions to store block selection flags indicating selected memory blocks in response to the block address signals in the multi-block selection mode, and to provide to the block selection control lines BSCi the block selection signals for erasing the selected memory blocks simultaneously in response to the block selection flags in the multi-block erase mode. In the block erase verification mode, the block selector 60 functions to generate a block selection read signal VRYrd indicating whether or not the block is selected in response to the block selection control signal $\phi_{BSC}$.

Figure 6:
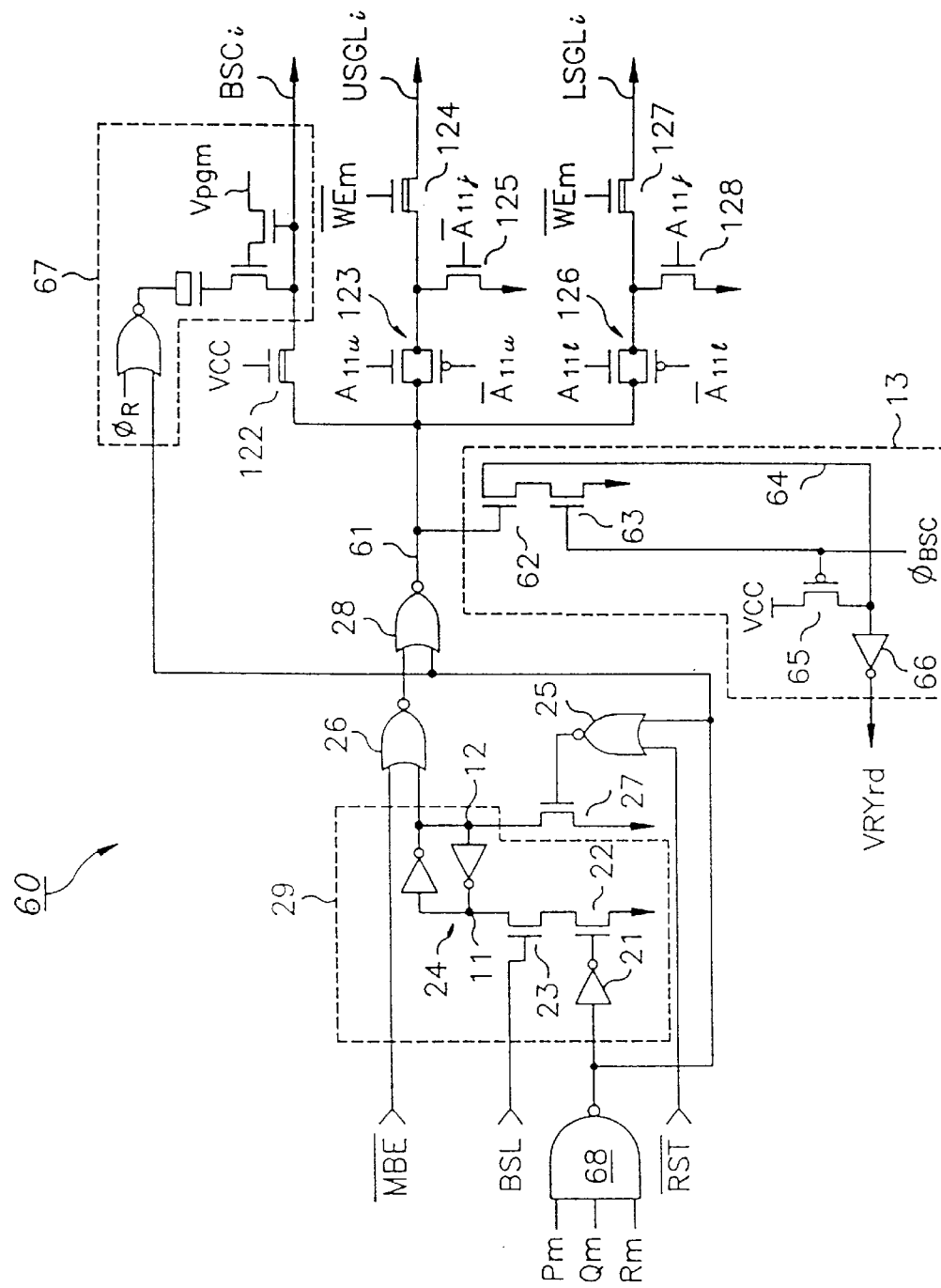
FIG. 6 is a schematic circuit diagram illustrating a block selector connected to the ith memory block according to the present invention.

FIG. 6 shows a schematic circuit diagram of the block selector 60. Referring to FIG. 6, a NAND gate main decoder 68 receives predecoding signals Pm, Qm and Rm. The output of the main decoder 68 is coupled to a gate of an N type transistor 22 through an inverter 21. The channels of the N type transistors 22 and 23 are serially connected between a node 11 and a ground, and a gate of the transistor 23 is coupled to a block selection signal BSL. A NOR gate 25 receives the output of the main decoder 68 and a reset signal $\overline{RST}$. A gate of an N type transistor 27 is coupled to the output of the NOR gate 25, and the channel of the N type transistor 27 is connected between a node 12 and the ground. Between the nodes 11 and 12 is connected a latch 24 at which the block selection flag is stored. A NOR gate 26 receives the output of the latch 24 and a multi-block selection signal $\overline{MBE}$, and a NOR gate 28 receives the output of the NOR gate 26 and the output of the main decoder 68. The part composed of the latch 24, N type transistors 22 and 23 and the inverter 21 is storing means 29 for storing the block selection flag. The part composed of the N type transistor 27 and the NOR gate 25 is for changing the block selection flag stored at the storing means 29 into the reset flag when the memory transistors within the selected memory block are successfully erased. The output of the NOR gate 28 and the gate of an N type transistor 62 are coupled to a line 61. The gate of an N type transistor 63 is coupled to the block selection control signal $\phi_{BSC}$. The channel of a P type transistor 65 is coupled between the power supply voltage Vcc and a line 64, and the gate thereof is coupled to the block selection control signal $\phi_{BSC}$. The line 64 provides the block selection read signal VRYrd through an inverter 66. The line 61 is coupled to the block selection control line BSCi through a D type transistor 122. The reference numeral 67 is a circuit for providing a high program voltage to the block selection control line BSCi in the program mode. The circuit 67 is disabled in the multi-block selection mode, block erase mode and block erase verification mode according to the present invention. A transfer gate 123 and a D type transistor 124 are serially connected between the line 61 and the upper selection gate line USGLi, and a transfer gate 126 and a D type transistor 127 are serially connected between the line 61 and the lower selection gate line LSGLi. The transfer gate 123 and D type transistor 124 are connected in parallel to the transfer gate 126 and D type transistor 127. An N type transistor 125 is coupled between a reference potential and a connection node placed between the transfer gate 123 and the D type transistor 124, and an N type transistor 128 is coupled between the reference potential and a connection node placed between the transfer gate 126 and the D type transistor 127. As disclosed in Korean patent application No. 93-390, in the block erase mode, the transfer gates 123 and 126 are turned on, the signal $\overline{WEm}$ is in a logic "low" state and the transistors 125 and 128 are turned off. In the block erase verification mode, the transfer gates 123 and 126 are turned on, and the transistors 124 and 127 are turned on by the signal $\overline{WEm}$ of logic "high" state. However, the transistors 125 and 128 are turned off.

At the beginning of the multi-block selection mode, the output of the NOR gate 25 turns on the transistor 27 by the reset signal $\overline{RST}$ and the predecoding signals Pm, Qm and Rm of logic "high" state, and the latch 24 becomes the reset state, i.e., the logic "low" state. Thereafter, in response to the predecoding signals Pm, Qm and Rm and the block selection signal BSL, the latch 24 stores the block selection flag to be changed from the logic "low" state to the logic "high" state. Therefore, in the multi-block selection mode, the storing means 29 corresponding to the selected memory blocks designated by an external address store the block selection flag, and the storing means 29 corresponding to the unselected memory blocks maintain the reset state. In the block erase operation, in response to the multi-block selection signal $\overline{MBE}$ of logic "low" state and the predecoding signals Pm, Qm and Rm of logic "high" state, the line 61 corresponding to the latch 24 storing the block selection flag becomes the logic "high" state, and the line 61 corresponding to the latches 24 storing the reset state becomes the logic "low" state. Consequently, the block selection control lines BSCi corresponding to the selected memory blocks are in the logic "high" state and the block selection control lines BSCi corresponding to the unselected memory blocks are in the logic "low" state.

In the block erase verification mode, memory blocks are sequentially designated by the predecoding signals Pm, Qm and Rm. Therefore, in the case that the unselected memory block, i.e., the memory block relating to the latch 24 storing the reset state is selected by the predecoding signals Pm, Qm and Rm, the N type transistor 62 is turned off by the line 61 of logic "low" state, and the block selection read signal VRYrd of logic "low" state is generated. However, in the case that the selected memory block, i.e., the memory block relating to the latch 24 storing the block selection flag is selected by the predecoding signals Pm, Qm and Rm, the N type transistors 62 and 63 are turned on by the line 61 of logic "high" state and the block selection control signal $\phi_{BSC}$, and the block selection read signal VRYrd of logic "high" state is generated. The circuit 13 composed of the N type transistors 62 and 63, P type transistor 65 and inverter 66 is judging means for judging whether or not the storing means 29 stores the block selection flag, i.e., whether or not the block selector 60 corresponds to the selected memory block.

At the beginning of the multi-block selection mode, a column address counter 100 of FIG. 1 makes the column address signals $A_{12}$ to $A_{21}$ and the complementary signals thereof $\overline{A_{12}}$ to $\overline{A_{21}}$ the logic "high" state in response to the control signal $\phi_{a10}$ of logic "high" state. Thereafter, the column address counter 100 generates the block selection address signals $A_{12}$, $\overline{A_{12}}$ to $A_{21}$, $\overline{A_{21}}$ in response to the external column address signals a12 to a21. In the block erase verification mode, the column address counter 100 functions to generate the block selection address signals $A_{12}$, $\overline{A_{12}}$ to $A_{21}$, $\overline{A_{21}}$ for selecting the memory blocks $BK_1$ to $BK_{1,024}$ sequentially.

Figure 7A:
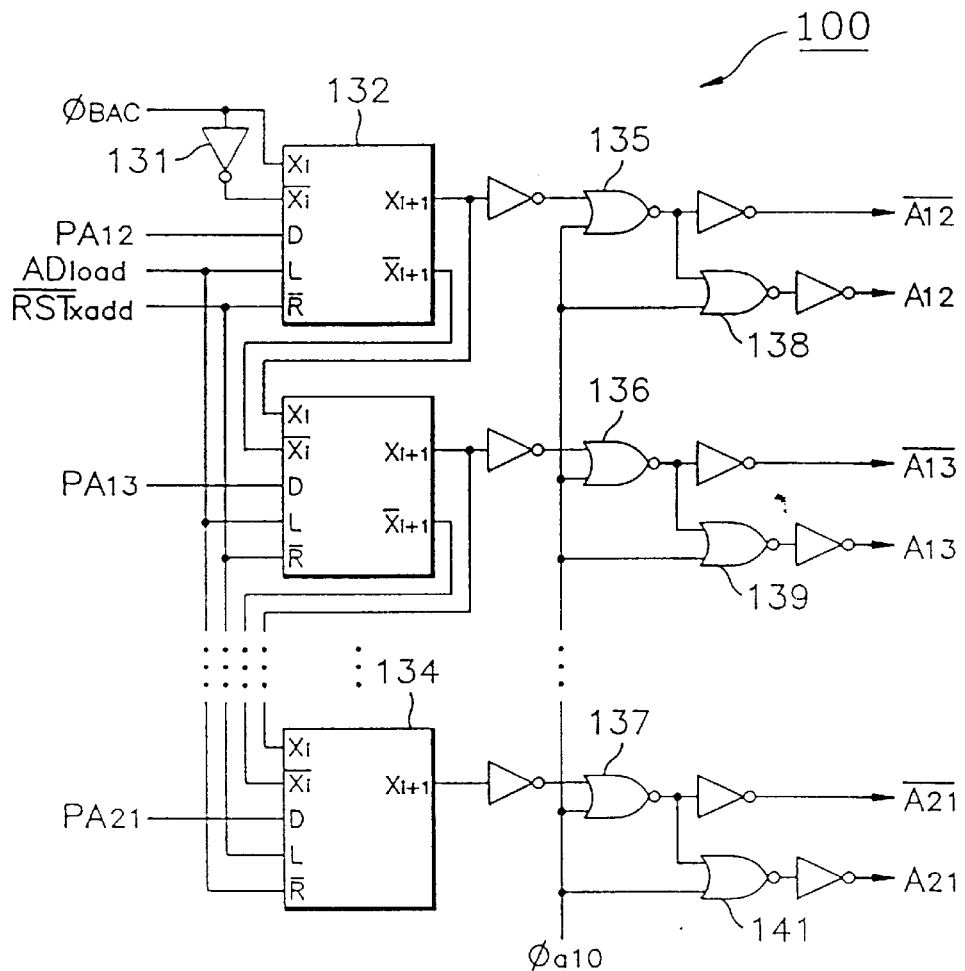
FIG. 7 made up of 7A and 7B is a schematic circuit diagram of a column address counter according to the present invention.
Figure 7B:
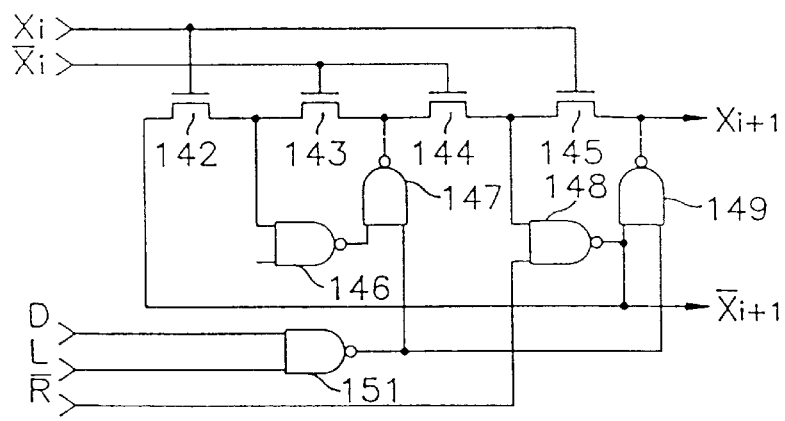

FIG. 7A shows a schematic circuit diagram of the column address counter 100, and FIG. 7B shows a schematic circuit diagram of one of the stages of the counter in FIG. 7A.

Referring to FIG. 7A, the output terminals $X_{i+1}$ and their complementary terminals $\overline{X}_{i+1}$ in the output terminals of the stages 132 to 134 of the counter 100 are connected to the clock input terminals $X_i$ and their complementary terminals $\overline{X}_i$. The address input terminals D of the stages 132 to 134 respectively receive the block address signals $PA_{12}$ to $PA_{20}$, and the address load terminals L receive the address load signal ADload from a control circuit 80. Reset terminals $\overline{R}$ receive the address reset signal $\overline{RST}_{xadd}$ from the control circuit 80. First input terminals of the NOR gates 135 to 137 are respectively connected to the output terminals $X_{i+1}$ of the stages 132 to 134 through inverters, and the second input terminals of the NOR gates 135 to 137 and the first input terminals of the NOR gates 138 to 141 receive a counter holding signal $\phi_{a10}$ from the control circuit 80. The second input terminals of the NOR gates 138 to 141 are respectively connected to the output terminals of the NOR gates 135 to 137. The output terminals of the NOR gates 138 to 141 and the output terminals of the NOR gates 135 to 137 respectively output the block selection address signals $A_{12}$ to $A_{21}$ and their complementary signals $\overline{A_{12}}$ to $\overline{A_{21}}$ through inverters. The clock input terminal $X_i$ of the first stage 132 directly receives the block address clock $\phi_{BAC}$ from an erase verification control circuit 90, and its complementary input terminal $\overline{X}_i$ receives the inverted block address clock through an inverter 131.

Referring to FIG. 7B, each stage comprises N type transistors 142 to 145 and NAND gates 146 to 151. When the clock input terminal $X_i$ is in the logic "low" state (its complementary input terminal $\overline{X}_i$ is in the logic "high" state) and the reset terminal $\overline{R}$ and the address load terminal L are respectively in the logic "low" and "high" states, the output terminal $X_{i+1}$ outputs the logic state of the input terminal D and the output terminal $\overline{X}_{i+1}$ remains the logic "high" state. Therefore, in the multi-block selection mode, the stages 132 to 134 of FIG. 7A receive the block address signals $PA_{12}$ to $PA_{21}$ at the address input terminals D and then generate the block selection address signals $A_{12}$ to $A_{21}$ and their complementary signals $\overline{A_{12}}$ to $\overline{A_{21}}$ in response thereto. If the address load terminal L and the clock input terminal $X_i$ are in the logic "low" state, and the reset terminal $\overline{R}$ goes from the logic "high" state to the logic "low" state, the output terminal $X_{i+1}$ is reset to the logic "low" state ($\overline{X}_{i+1}$ is reset to the logic "high" state). If the clock is applied to the clock input terminal $X_i$ after the reset terminal $\overline{R}$ is changed from the logic "low" state to the logic "high" state, every time the clock goes from the logic "high" state to the logic "low" state, the logic state of the output terminal $X_{i+1}$ is changed. Therefore, with the address load signal ADload and address reset signal $\overline{RST}_{xadd}$ of logic "low" state, the column address counter 100 of FIG. 7A performs a sequential count up operation in the erase verification mode every time the block address clock $\phi_{BAC}$ goes from the logic "high" state to the logic "low" state. The counter holding signal $\phi_{a10}$ remains the logic "high" state at the beginning of the multi-block selection mode and in the block erase mode, and thereby the block selection address signals $A_{12}$ to $A_{21}$ and their complementary signals $\overline{A_{12}}$ to $\overline{A_{21}}$ maintain the logic "high" state.

The column predecoder 70 of FIG. 1 functions to receive the block selection address signals $A_{12}$ to $A_{21}$ and their complementary signals $\overline{A_{12}}$ to $\overline{A_{21}}$ from the column address counter 100 and to generate the predecoding signals Pm, Qm and Rm. The predecoding signal Pm is generated by decoding the block selection address signals $A_{12}$, $\overline{A_{12}}$, $A_{13}$, $\overline{A_{13}}$ and $A_{14}$, $\overline{A_{14}}$, the predecoding signal Qm is generated by decoding the block selection address signals $A_{15}$, $\overline{A_{15}}$, $A_{16}$, $\overline{A_{16}}$ and $A_{17}$, $\overline{A_{17}}$, and the predecoding signal Rm is generated by decoding the block selection address signals $A_{18}$, $\overline{A_{18}}$, $A_{19}$, $\overline{A_{19}}$ and $A_{20}$, $\overline{A_{20}}$. The predecoding circuit is typically comprised of NAND gates and inverters.

The control circuit 80 of FIG. 1 functions to supply the control signals $\phi_{a10}$, $\overline{RST}_{xadd}$ and ADload to the column address counter 100, the control signals $\overline{RST}$, $\overline{MBE}$ and BSL to the block selector 60 and the control signal $\overline{\phi}_{eravf}$ to the control circuit 90 during the erase verification operation according to respective operation modes of the present invention.

Figure 8:
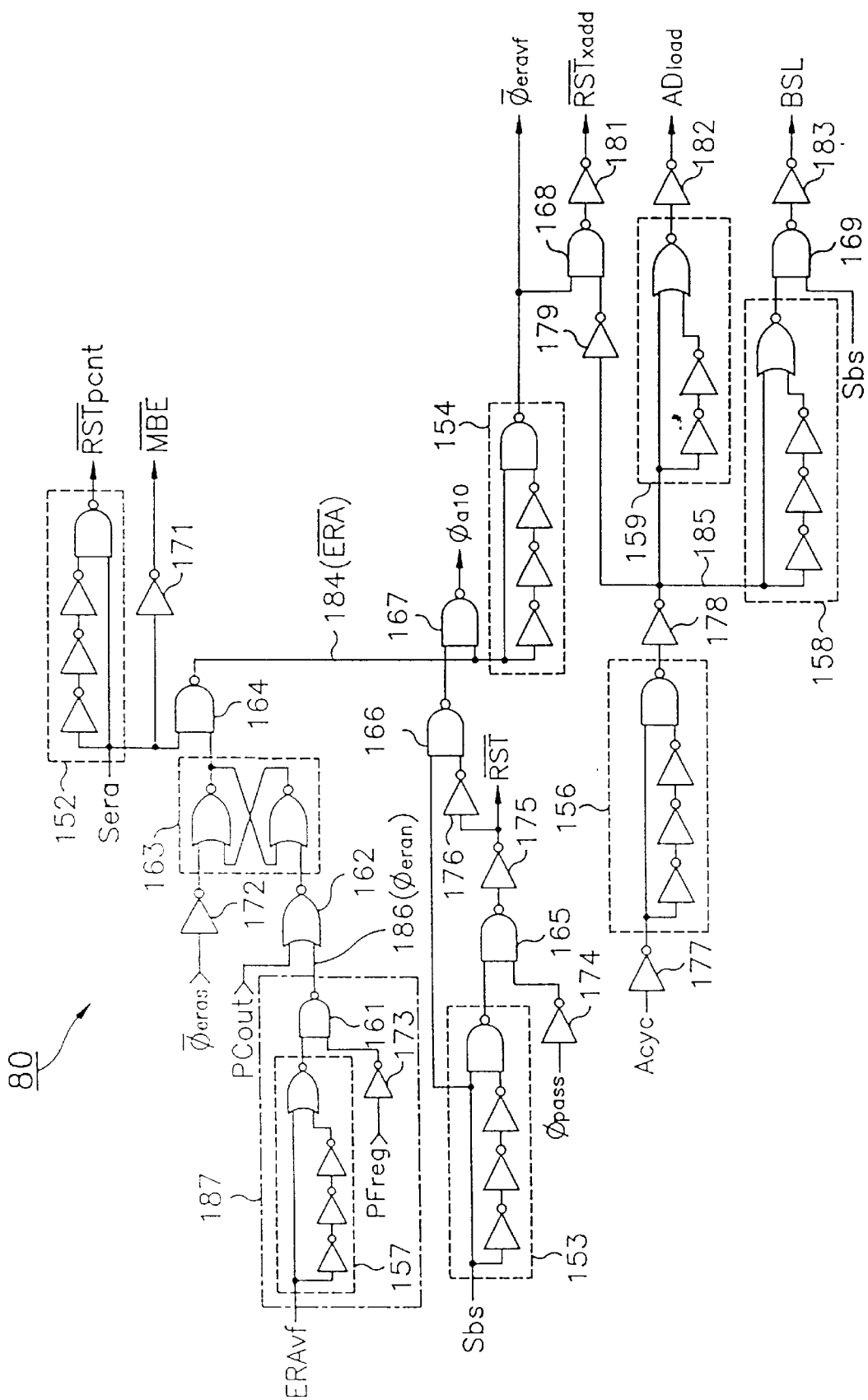
FIG. 8 is a schematic circuit diagram of a control circuit according to the present invention.

FIG. 8 illustrates a schematic circuit diagram of the control circuit 80. The control circuit 80 receives the multi-block selection command flag Sbs from a command register 130 in the multi-block selection mode. At this time, a multi-block erase command flag Sera applied from the command register 130 is in the logic "low" state, and then the signal $\overline{ERA}$ on the output line 184 of the NAND gate 164 is in the logic "high" state. In the multi-block selection mode, the multi-block selection command flag Sbs goes from the logic "low" state to the logic "high" state, and thereby a short pulse generator 153 provides a short pulse of logic "low" state to a NAND gate 165. Thus, an inverter 175 outputs the reset signal $\overline{RST}$ of logic "low" state. A NAND gate 166 outputs the short pulse of logic "low" state to a NAND gate 167, and thereby the counter holding signal $\phi_{a10}$ of logic "low" state is generated. Hence, at the beginning of the multi-block selection mode when the multi-block selection command signal Sbs goes from the logic "low" state to the logic "high" state, the reset signal $\overline{RST}$ becomes the short pulse of logic "low" state and the counter holding signal $\phi_{a10}$ becomes the short pulse of logic "high" state. Thereafter, the block selection address signal is received according to the toggle of the external write enable signal $\overline{WE}$, and then an address cycle signal Acyc indicating the reception of the block selection address signal is received. The address cycle signal Acyc is the clock pulse of the logic "high" state, and immediately after the signal Acyc goes from the logic "high" state to the logic "low" state, the short pulse of logic "high" state is generated on the line 185 through an inverter 177, the short pulse generator 156 and an inverter 178. The NAND gate 168 receives the short pulse of logic "low" state through an inverter 179, and the address reset signal $\overline{RST}_{xadd}$ is outputted through an inverter 181. The address load signal ADload becomes the extended clock pulse of logic "high" state through a pulse extension circuit 159 and an inverter 182 in response to the short pulse of logic "high" state on the line 185. If the short pulse of logic "high" state on the line 185 goes to the logic "low" state, a NAND gate 169 receives the output of the short pulse generator 158 and the multi-block selection command flag Sbs, and the block selection signal BSL becomes the clock pulse of logic "high" state through an inverter 183. Every time the block selection address signals are designated from the external, the address reset signal $\overline{RST}_{xadd}$, address load signal ADload and block selection signal BSL become the short pulse of logic "low" state, the extended pulse of logic "high" state and the short pulse of logic "high" state, respectively.

The multi-block selection mode ends with the input of the multi-block erase command. With the input of the multi-block erase command, the multi-block selection command flag Sbs goes to the logic "low" state and the multi-block erase command flag Sera goes to the logic "high" state. In response to the multi-block erase command flag Sera of logic "high" state, the short pulse generator 152 outputs the loop counter reset signal $\overline{RST}_{pcnt}$ of logic "low" state, and the multi-block selection signal $\overline{MBE}$ goes to the logic "low" state. At the same time, the NAND gate 164 outputs the logic "low" state to the line 184 in response to the multi-block erase command flag Sera and the output signal of the flip-flop 163 of logic "high" state. Thereby, the counter holding signal $\phi_{a10}$ becomes the logic "high" state through the NAND gate 167.

After the multi-block erase operation is performed for about 5 msec, an erase end signal $\phi_{eras}$ is generated from a timer (not shown). The erase verification mode is performed right after the completion of the multi-block erase mode by the erase end signal $\phi_{eras}$. The flip-flop 163 receiving the erase end signal $\phi_{eras}$ through the inverter 172 is latched from the logic "high" state to the logic "low" state, and the NAND gate 164 generates on the line 184 the signal $\overline{ERA}$ of logic "high" state. Therefore, the counter holding signal $\phi_{a10}$ goes to the logic "low" state, and the erase verification start signal $\overline{\phi}_{eravf}$ is passed through the short pulse generator 154 to be the short pulse of logic "low" state. Thereby, the address reset signal $\overline{RST}_{xadd}$ becomes the short pulse of logic "low" state. At the end of the erase verification mode, the erase verification signal ERAvf goes from the logic "high" state to the "low" state, and the short pulse generator 157 generates the short pulse of logic "high" state. At this time, in the sequential verification operation of the memory blocks, if any one of the memory blocks was not successfully erased, the pass/fail signal PFreg is in the logic "low" state. Thus, the erase verification end signal $\phi_{eran}$ on the output line 186 of the NAND gate 161 becomes the short pulse of logic "low" state. As will be described hereinafter, in the case that the number of the erase verification cycles does not reach a predetermined value, the output signal PCout of the loop counter 120 maintains the logic "low" state. Hence, the output of the NOR gate 162 generates the short pulse of logic "high" state and the flip-flop 163 is latched from the logic "low" state to the logic "high" state. The signal $\overline{ERA}$ on the line 184 goes to the logic "low" state, and the counter holding signal $\phi_{a10}$ thereby goes to the logic "high" state. Consequentially, the multi-block erase operation is performed again right after the completion of the multi-block erase verification mode.

In the multi-block erase verification mode, the erase verification control circuit 90 of FIG. 1 provides the block selection control signal $\phi_{BSC}$ to the block selector 60, and receives the block selection read signal VRYrd indicating whether or not the memory block to be verified is that selected in the multi-block selection mode. The erase verification control circuit 90 receives the erase verification start signal $\overline{\phi}_{eravf}$ from the control circuit 80, and provides the block address clock $\phi_{BAC}$ to the column address counter 100 and the erase verification signal ERAvf to the control circuit 80.

Figure 9:
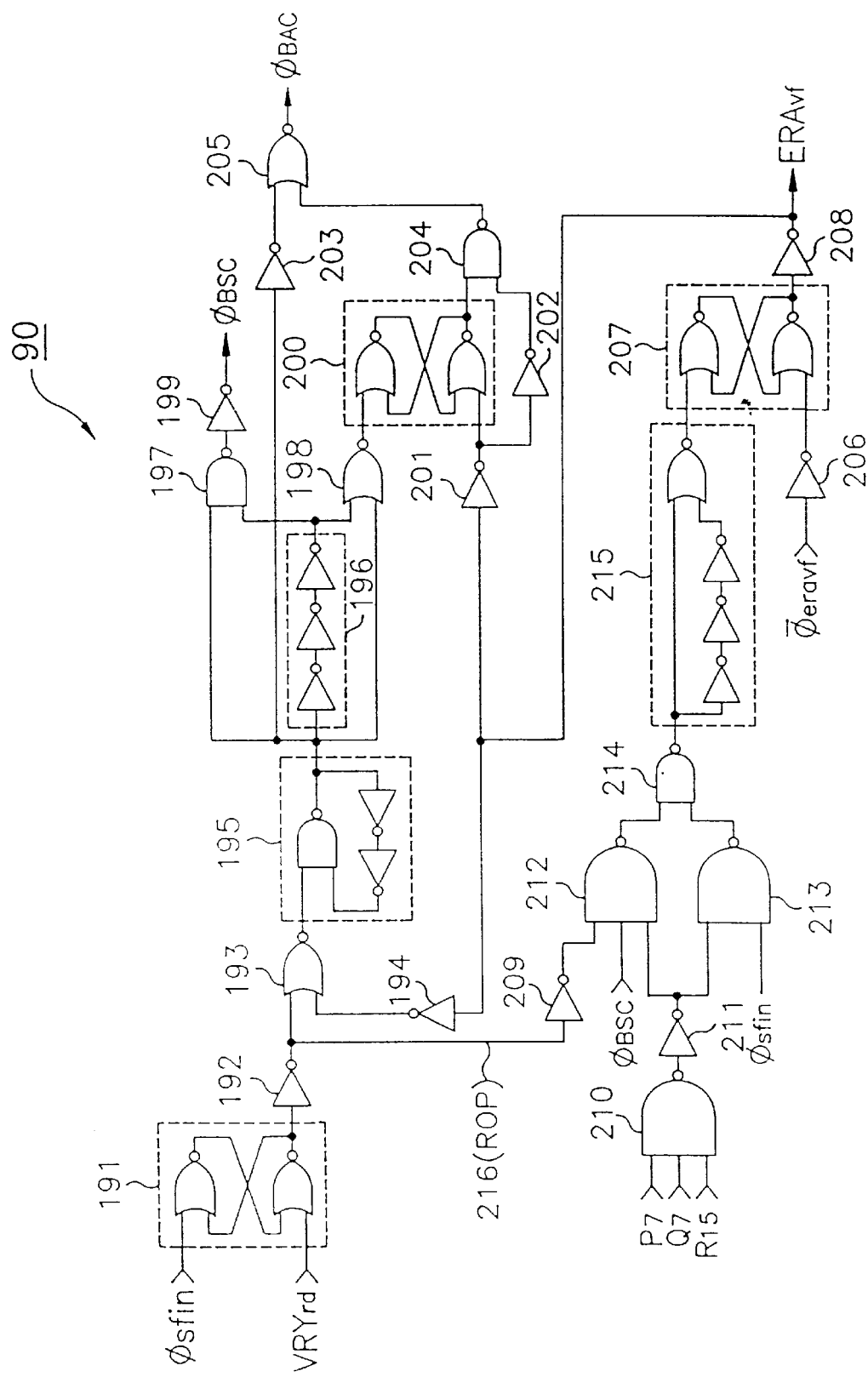
FIG. 9 is a schematic circuit diagram of an erase verification control circuit according to the present invention.

FIG. 9 illustrates a schematic circuit diagram of the erase verification control circuit 90. The flip-flop 207 is latched to the logic "high" state in the multi-block selection mode and multi-block erase mode. Thus, the erase verification signal ERAvf is passed through an inverter 208 and maintains the logic "low" state during the multi-block selection mode and multi-block erase mode. A NOR gate 193 receives the logic "high" signal through an inverter 194 and thus outputs the logic "low" signal. Thereby, a clock generator 195 outputs the logic "low" state, and the block selection control signal $\phi_{BSC}$ is in the logic "low" state during the multi-block selection mode and multi-block erase mode. Additionally, in response to the erase verification signal ERAvf of the logic "low" state, the block address clock $\phi_{BAC}$ is passed through inverters 201 and 202, a NAND gate 204 and a NOR gate 205 to be the logic "low" state, and a flip-flop 200 is latched to the logic "low" state. A flip-flop 191 is latched to the logic "high" state during the multi-block selection and erase modes. Hence, the erase verification control circuit 90 disables the erase verification signal ERAvf, the block selection control signal $\phi_{BSC}$ and the block address clock $\phi_{BAC}$ to the logic "low" state during the multi-block selection and erase modes.

At the beginning of the erase verification mode, the erase verification start signal $\overline{\phi}_{eravf}$ of logic "low" state is applied from the control circuit 80 to the erase verification control circuit 90, and a flip-flop 207 is thereby latched to the logic "low" state. Then, the erase verification signal ERAvf goes from the logic "low" state to the logic "high" state, and a NOR gate 193 outputs the logic "high" signal. A clock generator 195 starts to generate the clock in response to the output of the NOR gate 193. When the clock generated from the clock generator 195 goes from the logic "low" state to the logic "high" state, the block selection control signal $\phi_{BSC}$ generates the short pulse of logic "high" state. When the clock generated from the clock generator 195 goes from the logic "high" state to the logic "low" state, the NOR gate 198 generates the short pulse of logic "high" state, and the flip-flop 200 is thereby latched to the logic "high" state. The NAND gate 204 becomes the logic "low" state and the NOR gate 205 outputs the block address clock $\phi_{BAC}$. As described above, whenever the block address clock $\phi_{BAC}$ goes from the logic "high" state to the logic "low" state, the column address counter 100 of FIG. 7A generates the address signals which designate the memory blocks sequentially. If the storing means 29 of the block selector 60 corresponding to the memory block designated by the column address counter 100 is not selected during the multi-block selection mode, the erase verification for this memory block is not performed. However, if the storing means 29 of the block selector 60 corresponding to the memory block designated by the column address counter 100 stores the block selection flag, the ling 61 of FIG. 6 becomes the logic "high" state, and the block selection read signal VRYrd is generated in response to the block selection control signal $\phi_{BSC}$ of logic "high" state. The flip-flop 191 of FIG. 9 is latched to the logic "low" state in response to the block selection read signal VRYrd of logic "high" state, and thereby the signal ROP on the output line 216 of the inverter 192 becomes the logic "high" state. The clock generator 195 stops generating the clock and outputs the logic "high" signal, and thereby the block address clock $\phi_{BAC}$ maintains the logic "high" state. At this time, the erase verify read operation for the designated memory block is performed, and thereafter, the verification read end signal $\phi_{sfin}$ is generated. The flip-flop 191 is latched from the logic "low" state to the logic "high" state by the verification read end signal $\phi_{sfin}$ of logic "high" state, and thereby the signal ROP on the output line 216 becomes the logic "low" state. Then, the clock generator 195 generates the clock again to output the block address clock $\phi_{BAC}$. The circuit part comprising the NAND gates 210, 212, 213 and 214, the inverters 209 and 211, and the circuit 215 latches the flip-flop 207 to the logic "high" state at the completion of the erase verification cycle, and thereby the erase verification signal ERAvf becomes the logic "low" state through the inverter 208. The output of the NAND gate 204 becomes the logic "high" state through the inverters 201 and 202, and at the same time the flip-flop 200 is latched to the logic "low" state. Thereby, the block address clock $\phi_{BAC}$ becomes the logic "low" state. The clock generator 195 stops the generation of the clock in response to the logic "low" state.

After the memory block selected by the block selection address signals is erased, the pass/fail detector 110 of FIG. 1 detects data read-out from the memory block with a sense amplifier and provides the signals indicating whether or not all the memory cells within the selected memory block are erased below a predetermined threshold value.

Figure 10A:
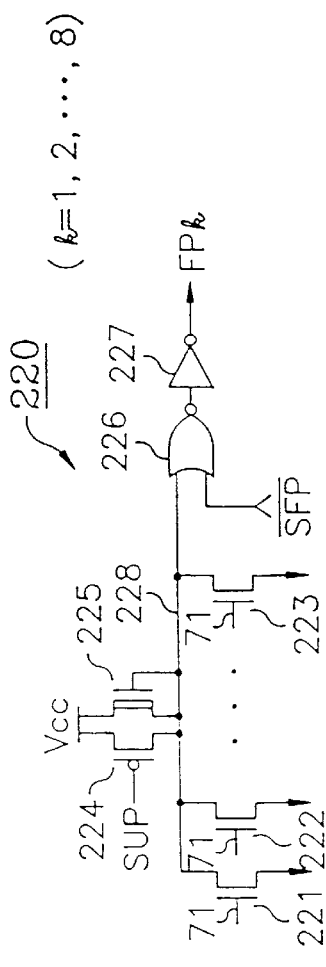
FIGS. 10A and 10B are schematic circuit diagrams of a pass/fail detection circuit according to the present invention.
Figure 10B:
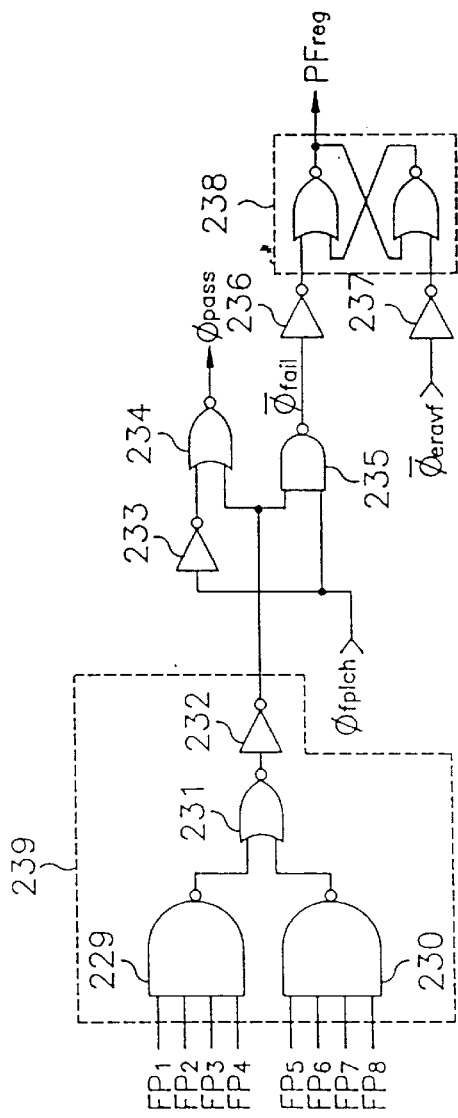

FIGS. 10A and 10B illustrate schematic circuit diagram of the pass/fail detector 110. Referring to FIG. 10A, the erase verification detector 220 related to the kth row block of FIG. 2 is illustrated. N type transistors 221 to 223 have their channels connected in parallel between a line 228 and the reference potential, and their gates respectively connected to the lines 71. The channels of P type transistor 224 and D type transistor 225 are connected in parallel between the power supply voltage Vcc and the line 228. A verification control signal SUP to be the logic "high" state during the erase verification operation is applied to the gate of the P type transistor 224, and the gate of the D type transistor 225 is coupled to the line 228. Two input terminals of a NOR gate 226 are respectively connected to the line 228 and the signal $\overline{SFP}$, i.e., the complementary signal of the signal SUP, and the erase verification detection signal FPk of the kth row block is outputted through an inverter 227. If all the memory cells within the memory block related to the kth row block are successfully erased, the lines 71 are rendered to the logic "low" state, the line 228 to the logic "high" state, and the erase verification detection signal FPk to the logic "high" state. If at least one of the memory cells within the memory block related to the kth row block is not successfully erased, at least one of the lines 71 becomes the logic "high" state, and the erase verification detection signal FPk goes to the logic "low" state.

FIG. 10B illustrates means for judging whether or not the memory cells within the selected memory block are successfully erased in response to the erase verification detection signal FPk(k=1, 2 . . . 8) outputted from the erase verification detector 220. In the figure, an adding circuit 239 comprises NAND gates 229 and 230 for receiving the erase verification detection signals $FP_1$ to $FP_8$, a NOR gate 231 for receiving the output of the NAND gates 229 and 230, and an inverter 232. If all of the memory cells within the selected memory block are successfully erased, the adding circuit 239 outputs the logic "low" state, and a NOR gate 234 receives the pass/fail latch signal $\phi_{latch}$ through an inverter 233 and outputs the pass signal $\phi_{pass}$ of logic "high" state. However, if at least one of the memory cells within the selected memory block is not successfully erased, the adding circuit 239 outputs the logic "high" state, and a NAND gate 235 receives the pass/fail latch signal $\phi_{latch}$ and outputs the fail signal $\overline{\phi}_{fail}$ of logic "low" state. A flip-flop 238 is latched to the logic "high" state in response to the short pulse $\overline{\phi}_{eravf}$ of logic "low" state at the beginning of the erase verification operation. The flip-flop 238 receives the fail signal $\overline{\phi}_{fail}$ of logic "low" state through an inverter 236 and is latched to the logic "low" state.

Thus, if the pass/fail signal PFreg of logic "low" state is generated, the multi-block erase operation is performed after the completion of the erase verification operation.

Figure 11A:
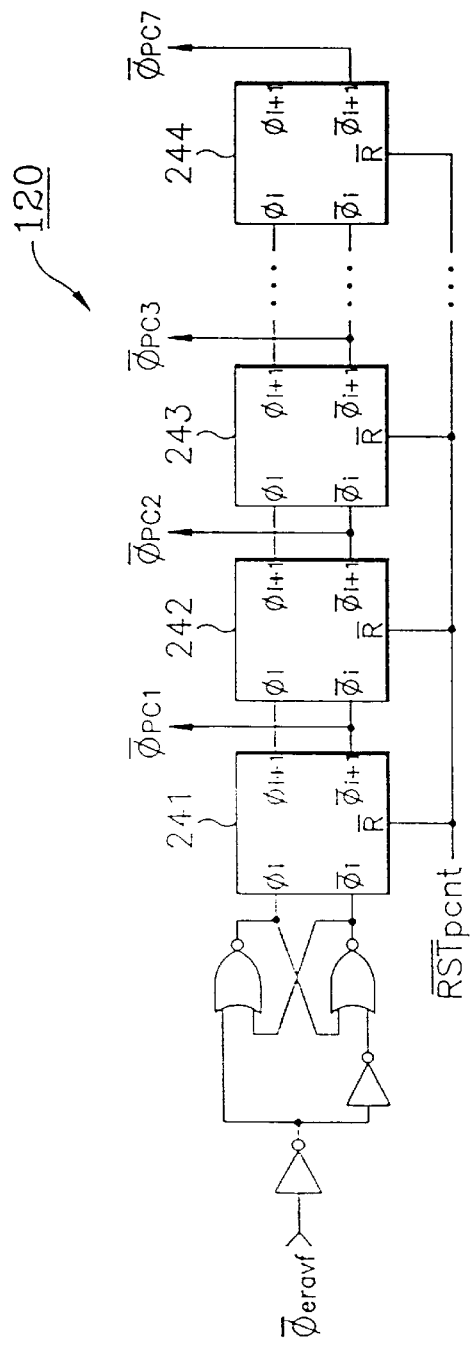
FIGS. 11A to 11C are schematic circuit diagrams of a loop counter according to the present invention.
Figure 11B:
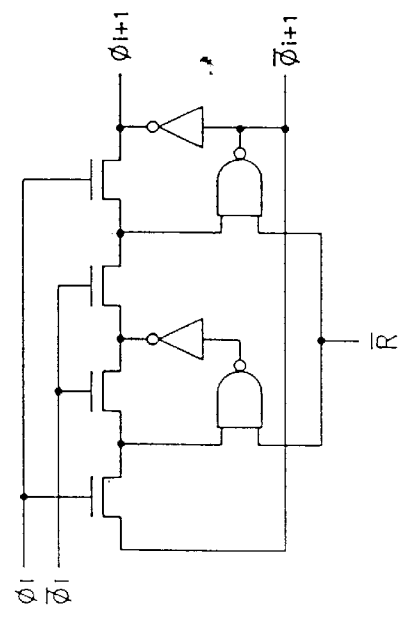
Figure 11C:
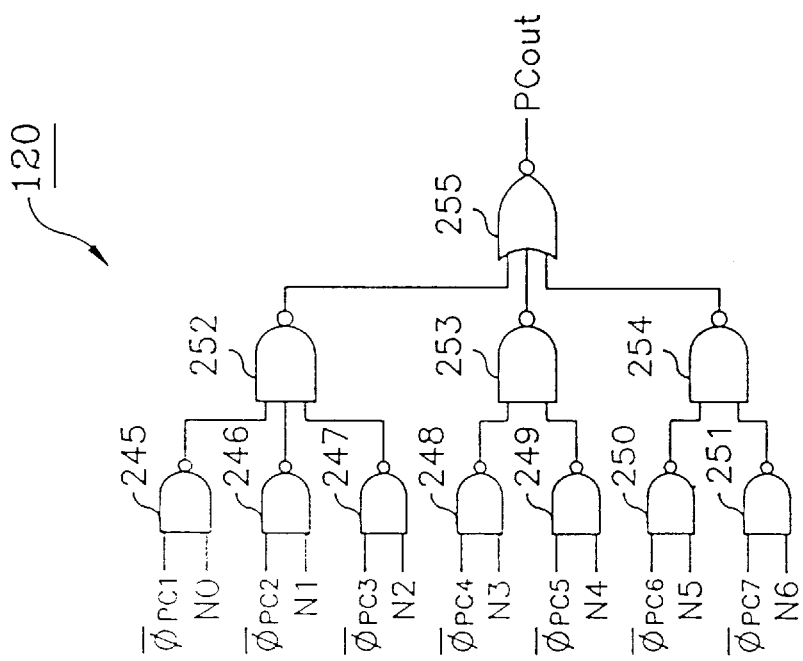

The loop counter 120 of FIG. 1 is for setting up the number of times of the repetition of the multi-block erase and verification modes. FIGS. 11A to 11C show schematic circuit diagrams of the loop counter 120.

A binary counter of FIG. 1A is reset by the loop counter reset signal $\overline{RST}_{pcnt}$ at the beginning of the initial block erase operation. The binary counter performs the down count in response to the erase verification start signal $\overline{\phi}_{eravf}$ generated at the beginning of the erase verification operation. FIG. 11B is a schematic circuit diagram showing one of the stages 241 to 244 of the binary counter. The output signals $\overline{\phi}_{pc1}$ to $\overline{\phi}_{pc7}$ of respective stages of the counter are connected to first input terminals of the NAND gates 245 to 251 as shown in FIG. 11C, and the second input terminals thereof are for determining the maximum repeating frequency of the multi-block erase and verification modes. Assuming that the maximum repeating frequency is set to 16, the terminals N0 to N3 are connected to the power supply voltage Vcc and the remaining terminals N4 to N6 to the ground. Thus, when reaching a predetermined maximum repeating frequency, the loop counter 120 outputs the signal of logic "high" state from the NOR gate 255.

Returning to FIG. 1, in order to reduce the number of the external pins, external address signals are applied to the data I/O terminals I/O0 to I/O7. The control buffer 160 receives the external control signals, i.e., a chip enable signal $\overline{CE}$, an output enable signal $\overline{OE}$, a write enable signal $\overline{WE}$, an address latch enable signal ALE and a command latch enable signal CLE, and controls the command register 130, the column address buffer 140 and the row address buffer and decoder 150. The column address buffer 140 and the row address buffer and decoder 150 latch the addresses applied to the data I/O terminals I/O0 to I/O7 in response to the control signals from the control buffer 160. In addition, the command register 130 outputs various command signals in response to the control signals from the control buffer 160. Such a configuration is well known and is not the feature of the present invention.

Figure 12:
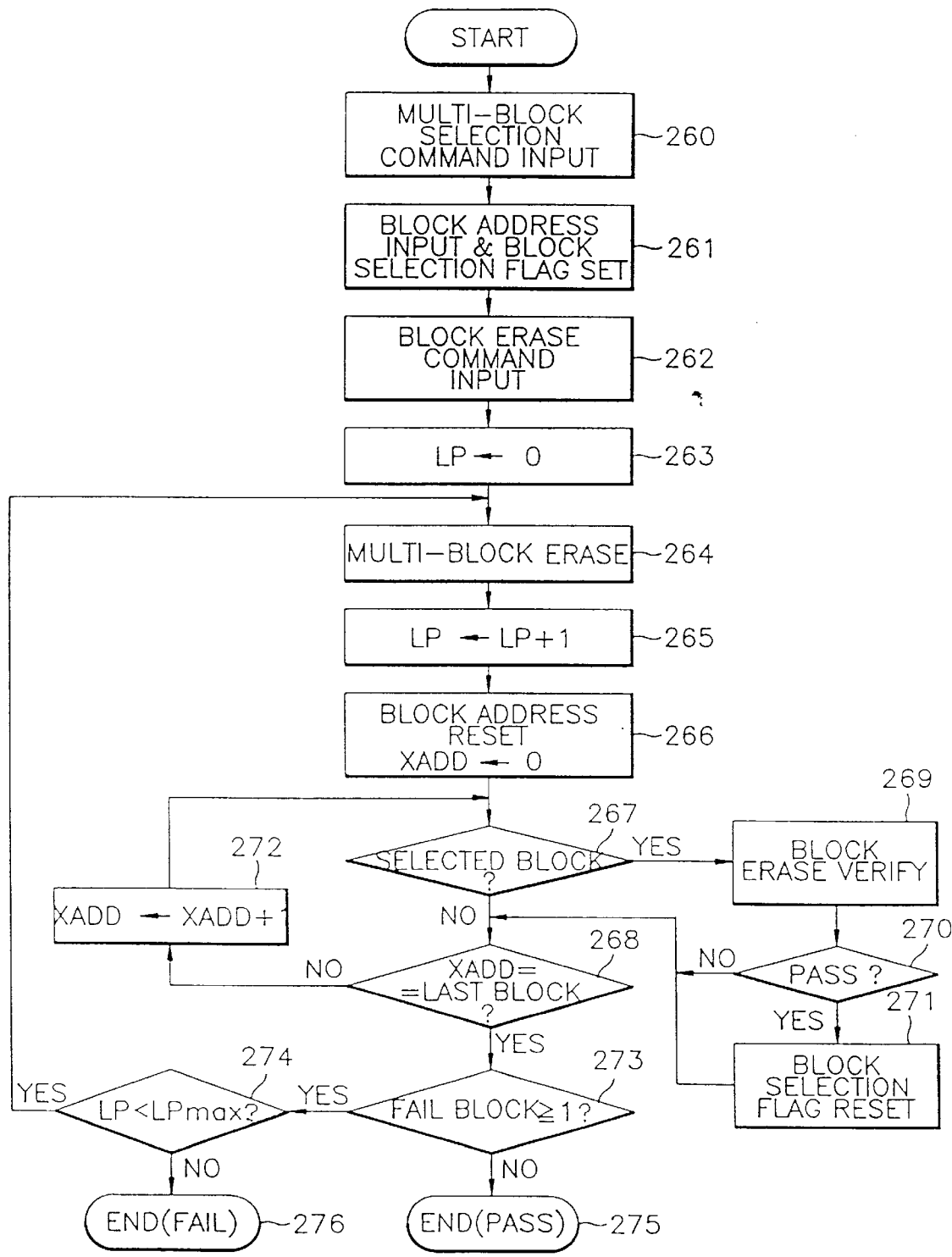
FIG. 12 is a flow chart showing the operational sequences of the multiblock selection mode, multi-block erase mode and erase verification mode according to the present invention.

FIG. 12 is a flow chart of the multi-block selection mode, multi-block erase mode and erase verification mode according to the present invention, and FIGS. 13A to 13E illustrate timing diagrams of various signals according to the present invention. The operation according to the present invention will be described hereinafter.

Multi-block selection mode

At time t1, the block selection command is received as shown in step 260 of FIG. 12. The multi-block selecting operation is performed by receiving the memory block selection command of 60 H(hexa code) when the chip enable signal $\overline{CE}$ goes to the logic "low" state, the command latch enable signal CLE is in the logic "high" state and the write enable signal $\overline{WE}$ is in the logic "low" state. When the write enable signal $\overline{WE}$ goes from the logic "low" state to the logic "high" state, the command register 130 receives the block selection command code, and the block selection command flag Sbs goes from the logic "low" state to the logic "high" state. Then, the control circuit 80 generates the short pulse $\overline{RST}$ of logic "low" state in response to the block selection command flag Sbs and then generates the counter holding signal $\phi_{a10}$ of logic "high" state in response thereto. The column address counter 100 of FIG. 7A maintains the block selection address signals $A_{12}, \overline{A_{12}}$ to $A_{21}, \overline{A_{21}}$ of logic "high" state in response to the counter holding signal $\phi_{a10}$ and maintains the predecoding signals Pm, Qm and Rm of logic "high" state through the column predecoder 70. Thus, the NOR gate 25 of FIG. 6 outputs the logic "high" state, the N type transistor 27 is turned on, and thereby the latch 24 stores the first logic state, i.e., the logic "low" state. That is, the storing means 29 related to the memory blocks store the reset flags of logic "low" state. When the address latch enable signal ALE is in the logic "high" state, and the write enable signal $\overline{WE}$ goes from the logic "low" state to the logic "high" state, the external column address signals applied to the data I/O terminals I/O0 to I/O7 are stored at the column address buffer 140 so as to select one memory block. If all of the external column address signals are applied to the column address buffer 140, the address cycle signal $A_{cyc}$ is generated. As shown in FIG. 13A, the control circuit 80 generates the address load signal $AD_{load}$, the address reset signal $\overline{RST}_{xadd}$ and the block selection signal BSL in response to the address cycle signal $A_{cyc}$ which goes from the logic "high" state to the logic "low" state. The address load signal $AD_{load}$, the address reset signal $\overline{RST}_{xadd}$ are applied to the column address counter 100 of FIG. 7A, and the predecoding signals Pm, Qm and Rm are generated in response to the block selection address signals $A_{12}, \overline{A_{12}}$ to $A_{21}, \overline{A_{21}}$ corresponding to the block address signals $PA_{12}$ to $PA_{21}$ for selecting the memory block. The main decoder 68 of FIG. 6 related to the memory block designated by the external address signals outputs the logic "low" state in response to the predecoding signals Pm, Qm and Rm of logic "High" state, and the N type transistor 22 is thereby turned on. A the same time, the N type transistor 23 is turned on in response to the block selection signal BSL of logic "high" state. Therefore, the latch 24 related to the memory block designated by the external address signals is latched from the reset flag(logic "low" state) to the block selection flag of logic "high" state, i.e., the second logic state as shown in step 261 of FIG. 12.

In a similar way as described above, with receiving the memory block selection commands and the external address signals designating memory block from the data I/O terminals I/O0 to I/O7, the corresponding latches 24 are sequentially latched from the first logic state to the second logic state.

The multi-block erase operation is performed right after the completion of the multi-block selection operation for selecting the memory blocks to be erased.

Multi-block erase mode

At time t2, the multi-block erase operation starts with the reception of the multi-block erase command D0(hexa code) at the data I/O terminals I/O0 to I/O7 when the command latch enable signal CLE is in the logic "high" state and the write enable signal $\overline{WE}$ is in the logic "low" state. As shown in step 262 of FIG. 12, if the multi-block erase command is received, the multi-block selection command flag Sbs and multi-block erase command flag Sera outputted from the command register 130 go to the logic "low" state and the logic "high" state, respectively. In response to the multi-block erase command flag Sera of logic "high" state, the short pulse generator 152 of FIG. 8 generates the loop counter reset signal $\overline{RST}_{pcnt}$ which is to be the short pulse of logic "low" state, and thereby the loop counter 120 of FIG. 11A resets the loop frequency LP to 0 as shown in step 263 of FIG. 12. At the same time, the multi-block selection signal $\overline{MBE}$ goes from the logic "high" state to the logic "low" state, and the signal $\overline{ERA}$ on the line 184 of FIG. 8 goes from the logic "high" state to the logic "low" state. Thus, the counter holding signal $\phi_{a10}$ becomes the logic "high" state.

During the multi-block erase operation, the column address counter 100 of FIG. 7A makes the block selection address signals $A_{12}, \overline{A_{12}}$ to $A_{21}, \overline{A_{21}}$ the logic "high" state in response to the counter holding signal $®_{a10}$ of logic "high" state. Thereby, the column predecoder 70 generates the predecoding signals Pm, Qm and Rm which maintain the logic "high" state during the multi-block erase operation. The main decoders 68 of FIG. 6 generate the logic "low" state in response to the predecoding signals Pm, Qm and Rm of logic "high" state. However, as the latches 24 corresponding to the memory blocks selected in the multi-block selection mode store the block selection flags of logic "high" state, the NOR gates 26 output the logic "low" state and thereby the NOR gates 28 output the logic "high" state. Hence, the block selection control lines $BSC_i$ related to the selected memory blocks become the logic "high" state, and the block selection transfer gates $BST_i$ connected to the block selection control lines $BSC_i$ are thereby turned on. As disclosed in Korean patent application No. 93-390, as the reference voltage of 0 volt is applied to the control gate lines CGL1 to CGL8 during the multi-block erase operation, the word lines UWL1 to UWL8 and LWL1 to LWL8 related to the selected memory blocks all remain the reference voltage.

The latches 24 of FIG. 6 related to the unselected memory blocks store the first logic state, and thereby the NOR gates 26 generate the logic "high" state.

The NOR gates 28 output the logic "low" state in response to the output of the NOR gates 26 of logic "high" state. The block selection lines $BSC_i$ related to the unselected memory blocks are in the logic "low" state. Thus, the block selection transfer gates $BST_i$ related to the unselected memory blocks are turned off, and the word lines UWL1 to UWL8 and LWL1 to LWL8 related thereto are in the floating state.

As shown in FIG. 4, the erase voltage of 18 V is applied through the electrode 114 connected to the well regions 76 and 74 in which the memory cells of the memory block are formed. Then, as the control gates of the memory transistors within the selected memory blocks are 0 V, the electrons are emitted from their floating gates to the well regions, thus being the erase state having the threshold voltage of −3 V, i.e., being data "1". However, as the word lines related to the unselected memory blocks are in the floating state as mentioned above, the word lines are capacitance coupled with the erase avoidance voltage by the application of the erase voltage, thus avoiding the erase. Therefore, as shown in step 264 of FIG. 12, the multi-block erase operations for the selected memory blocks are performed simultaneously.

At the completion of the multi-block erase operation performed for about 5 msec, the erase end signal $\overline{\phi}_{eras}$ is generated from a timer (not shown) as illustrated in FIG. 13B, and the multi-block erase verification operation is performed.

Multi-block erase verification mode

At time t3, the erase end signal $\overline{\phi}_{eras}$, i.e., the short pulse of logic "low" state is applied to the control circuit 80 of FIG. 8. In the multi-block erase verification operation, the multi-block erase command flag Sera and the multi-block selection command flag Sbs remain the logic "high" state and the logic "low" state, respectively. The flip-flop 163 is latched to the logic "low" state by the short pulse signal $\overline{\phi}_{eras}$ of logic "low" state. Thus, the signal $\overline{ERA}$ on the output line 184 of the NAND gate 164 goes from the logic "low" state to the logic "high" state, and the counter holding signal $\overline{\phi}_{a10}$ goes from the logic "high" state to the logic "low" state. In response to the signal $\overline{ERA}$, the erase verification start signal $\overline{\phi}_{eravf}$ becomes the logic "low" state, and the address reset signal $\overline{RST}_{xadd}$ becomes the logic "low" state. The column address counter 100 of FIG. 7A is reset by the address load signal $AD_{load}$ of logic "low" state and the address reset signal $\overline{RST}_{xadd}$ of logic "low" state, and thereby the block selection address signals $A_{12}$ to $A_{21}$ become the logic "low" state (their complementary signals $\overline{A}_{12}$ to $\overline{A}_{21}$ are all in the logic "high" state). Consequentially, the predecoding signals Pm, Qm and Rm designating the first memory block BK1 are applied to the main decoder 68 within the block selector 60 through the column predecoder 70.

The binary counter of FIG. 11A outputs the signals $\overline{\phi}_{PC1}, \overline{\phi}_{PC2}, \ldots \overline{\phi}_{PC7}$ as 0, 1 ... 1 in response to the erase verification start signal $\overline{\phi}_{eravf}$ of logic "low" state, and resets the loop frequency LP to 1 as shown in step 265 of FIG. 12.

The pass/fail detector 150 of FIG. 10B latches the flip-flop 238 to the logic "high" state in response to the short pulse signal $\overline{\phi}_{eravf}$ of logic "low" state. Thus, the pass/fail signal PFreg is latched to the logic "high" state.

The erase verification control circuit 90 of FIG. 9 receives the short pulse signal $\overline{\phi}_{eravf}$ of logic "low" state. Then, the flip-flop 207 is latched to the logic "low" state and thereby the erase verification signal ERAvf goes to the logic "high" state. In response to the erase verification signal ERAvf, the NOR gate 193 outputs the logic "high" state and thereby the clock generator 195 generates the clock pulses. Therefore, the block selection control signal $\phi_{BSC}$ of logic "high" state and the block address clock $\phi_{BAC}$ of logic "high" state are generated as shown in FIG. 13B. However, as the latch 24 of FIG. 6 related to the first memory block BK1 stores the reset state, i.e., the logic "low" state, the NOR gate 26 outputs the logic "high" state by the multi-block selection signal $\overline{MBE}$ maintaining the logic "low" state during the multi-block erase verification operation, and thereby the NOR gate 28 outputs the logic "low" state on the line 61. Thus, the block selection control line BSC1 related to the first block becomes the logic "low" state, and as a result, the first block is not selected. That is, the step 268 is performed after the step 267 of FIG. 12. At the same time, by the logic "low" state on the line 61, the N type transistor 62 is turned off and the block selection read signal VRYrd maintains the logic "low" state. In response to the block address clock $\phi_{BAC}$ which goes from the logic "high" state to the logic "low" state, the column address counter 100 of FIG. 7A is counted up. Consequentially, the predecoding signals Pm, Qm and Rm provides the signals for designating the second memory block BK2.

Thereafter, the next block selection control signal $\phi_{BSC}$ and block address clock $\phi_{BAC}$ are generated. As the latch 24 related to the second memory block BK2 stores the block selection flag, i.e., the logic "high" state, the second memory block BK2 becomes the selected memory block in step 267 and the erase verification operation for the selected memory block is performed in step 269. Thus, the NOR gate 28 provides the logic "high" state on the line 61 and thereby the transistors 62 and 63 are turned on. The block selection read signal VRYrd generates the pulse signal of logic "high" state and thereby the flip-flop 191 of FIG. 9 is latched to the logic "low" state. Hence, the output ROP of the inverter 192 goes to the logic "high" state, the NOR gate 193 outputs the logic "low" state and thereby the clock generator 195 goes to the logic "high" state. Therefore, the block address clock $\phi_{BAC}$ remains the logic "high" state and thereby the predecoding signals Pm, Qm and Rm which select the second memory block maintain the logic "high" state. Thus, by the logic "high" state on the line 61, the block selection control line BSC2 goes to the logic "high" state and the block selection transfer gates BST2 are turned on. In the multi-block erase verification mode, the verification voltage, i.e., 0 volt is applied to the control gate lines CGL1 to CGL8 of FIG. 2 and 5 V are applied to the upper and lower ground selection lines UGSL and LGSL. As disclosed in Korean patent application No. 93-390, when the address signal A11 is in the logic "high" state, the upper selection gate line USGLi becomes 5 volts, and when the address signal A11 is in the logic "low" state, the lower selection gate line LSGLi becomes 5 V. During the multi-block erase verification operation, the sense amplifier and page buffer 30 of FIG. 5 makes the control signals $\phi_1, \phi_3$, SBL and $\phi_5$ the logic "high" state and the control signals DCB, $\phi_2$ and $\phi_4$ the logic "low" state. Hence, the line 68 is in the logic "low" state and the P type transistors 54 are turned on. Thereby, the verification currents of 4 μA are supplied to the bit lines BLk-1 to BLk-256. If the upper memory block of the second memory block BK2 was selected and all the memory cells within the upper memory block have been successfully erased, the bit lines BLk-1 to BLk-256 are all grounded by the on state of the memory cells. The lines 71 are grounded in response to the on state of the transistors 39, 44 and 49. Thus, the transistors 221 to 223 of FIG. 10A are turned off and the erase verification detection signals FP1 to FP8 become the logic "high" state by the signals SUP and $\overline{SFP}$ of FIG. 13B. The pass signal $\phi_{pass}$ of logic "high" state is outputted from the NOR gate 234 of FIG. 10B by the pass/fail latch signal $\phi_{fplch}$. In step 270, whether the second memory block is passed or failed is checked, and if it is pass, the step 271 is performed. The inverter 174 of FIG. 8 outputs the logic "low" state in response to the pass signal $\phi_{pass}$, and thereby the NAND gate 165 and inverter 175 generate the reset signal $\overline{RST}$ of logic "low" state. The NOR gate 25 related to the second memory block BK2 outputs the logic "high" state and the transistor 27 is turned on. Thus, the block selection flag, i.e., the logic "high" state stored at the latch 24 is changed into the reset flag, i.e., the logic "low" state. Thereafter, by the verification detection end signal $\phi_{sfin}$, the flip-flop 191 of FIG. 9 is latched to the logic "high" state and the output ROP of the inverter 192 becomes the logic "low" state. The NOR gate 193 outputs the logic "high" state, and thereby the clock generator 195 is turned on. The block address clock $\phi_{BAC}$ goes from the logic "high" state to the logic "low" state, and thereby the column address counter 100 is counted up. In step 272, the predecoding signals Pm, Qm and Rm for designating the third memory block BK3 are generated. If the latch 24 related to the memory block designated in the same way as above stores the reset flag, i.e., the logic "low" state, the erase verification operation is not performed.

The erase verification operation for the memory blocks are sequentially performed as previously described. If at least one of the upper memory cells within the selected memory block BK 1,022 is not successfully erased, the corresponding bit line is charged to the logic "high" state, and thereby the corresponding erase verification detection signal FPk of FIG. 10A becomes the logic "low" state. The fail signal $\overline{\phi}_{fail}$ becomes the logic "low" state in response to the pass/fail latch signal $\phi_{fplch}$, and thereby the pass/fail signal PFreg is latched from the logic "high" state to the logic "low" state. After the fail signal $\overline{\phi}_{fail}$ of logic "low" state is generated, the verification read end signal $\phi_{sfin}$ is generated. The output signal ROP of the inverter 192 of FIG. 9 becomes the logic "low" state by the verification read end signal $\phi_{sfin}$, and thereby the block address clock $\phi_{BAC}$ also becomes the logic "low" state. With the process of the step 272, the column address counter 100 performs the count up operation by 1 and then designates the next memory block BK 1,023. As the latch 24 related to the memory block BK 1,023 does not store the block selection flag, the step 268 is performed after the step 267 of FIG. 12. As the memory block BK 1.023 is not the last memory block, the column address counter 100 performs the count up operation in step 272 in response to the block address clock $\phi_{BAC}$ which goes to the logic "low" state. That is, the last memory block BK 1.024 is designated. As the predecoding signals $P_7$, $Q_7$ and $R_{15}$ for selecting the last memory block are in the logic "high" state, the inverter 211 of FIG. 9 outputs the logic "high" state. When the block selection control signal $\phi_{BSC}$ goes from the logic "high" state to the logic "low" state, the NAND gate 212 goes from the logic "low" state to the logic "high" state, and thereby the NAND gate 214 goes from the logic "high" state to the logic "low" state. Thus, the short pulse generator 215 generates the short pulse signal of logic "high" state, and thereby the erase verification signal $ERA_{vf}$ goes from the logic "high" state to the logic "low" state. In response to the erase verification signal $ERA_{vf}$, the block selection control signal $\phi_{BAC}$ becomes the logic "low" state, and the circuit 187 of FIG. 8 generates the erase verification end signal $\phi_{eran}$ of logic "low" state at time t4 of FIG. 13B. As the column address signal XADD of the column address counter designates the last memory block, there exits a failed memory block, and it does not reach a predetermined maximum loop frequency $LP_{max}$, the second multi-block erase operation is performed in step 264.

In response to the erase verification end signal $\phi_{eran}$ which goes from the logic "high" state to the logic "low" state, the NOR gate 162 of FIG. 8 outputs the logic "high" state and the flip-flop 163 is latched to the logic "high" state. The signal $\overline{ERA}$ on the output line 184 of the NAND gate 164 becomes the logic "low" state, and the counter holding signal $\phi_{a10}$ goes to the logic "high" state in response thereto. The second multi-block erase operation is performed at time between t4 and t5 in the same way as the first multi-block erase operation. As described above, the second multi-block erase operation is performed for the memory cells related to the memory block BK 1,022 storing the block selection flag, and is not performed for the memory cells related to the remaining memory blocks BK1 to BK1,021, BK1,023 and BK1,024 storing the reset flags.

Figure 13C:
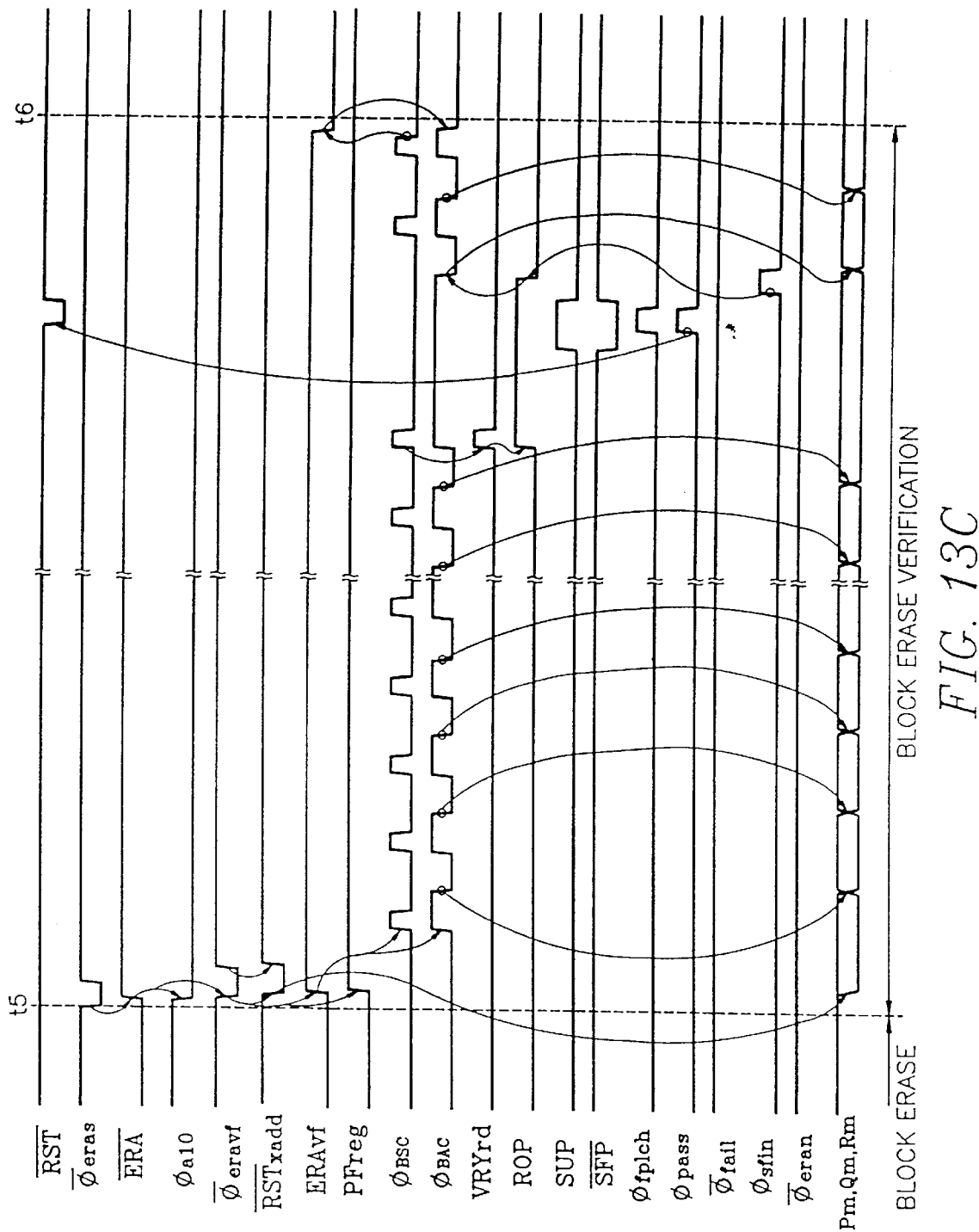

At time t5 of FIG. 13C, the second multi-block erase verification operation is performed in response to the erase end signal $\overline{\phi}_{eras}$ which goes to the logic "low" state. As afore-mentioned, in response to the erase end signal $\overline{\phi}_{eras}$, the signal $\overline{ERA}$ on the output line 184 of the NAND gate 164 becomes the logic "high" state and thereby the counter holding signal $\phi_{a10}$, becomes the logic "low" state. The erase verification start signal $\overline{\phi}_{eravf}$ becomes the short pulse signal of logic "low" state through the short pulse generator 154, and thereby the address reset signal $\overline{RST}_{xadd}$ also becomes the short pulse of logic "low" state. In response to the erase verification start signal $\overline{\phi}_{eravf}$, the loop counter 120 of FIG. 11 counts the second loop frequency and generates the loop counter output signal PCout of logic "low" state. In response to the erase verification start signal $\overline{\phi}_{eravf}$ of logic "low" state, the verification control circuit 90 generates the erase verification signal ERAvf of logic "high" state. The pass/fail detector 110 generates the pass/fail signal PFreg of logic "high" state in response to the erase verification start signal $\overline{\phi}_{eravf}$. In response to the address reset signal $\overline{RST}_{xadd}$ which goes to the logic "low" state, the column address counter 100 is reset and generates the block selection address signals for designating the first memory block BK1. In addition, in response to the erase verification signal ERAvf which goes to the logic "high" state, the erase verification control circuit 90 generates the block selection control signal $\overline{\phi}_{BSC}$ and the block address clock $\overline{\phi}_{BAC}$. Whenever the block address clock $\overline{\phi}_{BAC}$ goes to the logic "low" state, the column address counter 100 generates the block selection address signals designating the next memory block. However, as the latches 24 related to the memory blocks BK1 to BK1,021 store the reset flags, the erase verification operation is not performed, and the erase verification operation is performed only for the memory cells within the memory block related to the latch 24 storing the block selection flag. In the second multi-block erase operation, if all the memory cells within the memory block BK1,022 are successfully erased, the pass/fail detector 110 of FIG. 10 generates the pass signal $\phi_{pass}$ in response to the pass/fail latch signal $\phi_{fplch}$, and thereby the control circuit 80 of FIG. 8 generates the reset signal $\overline{RST}$. In response thereto, the latch 24 related to the memory block BK1.022 stores the reset flag. Thereafter, in response to the verification detection end signal $\phi_{sfin}$ which goes from the logic "low" state to the logic "high" state, the output signal ROP of the inverter 192 becomes the logic "low" state and the output of the NOR gate 193 becomes the logic "high" state. Thereby, the clock generator 195 is turned on. As the latches 24 related to the memory blocks BK1, 023 and BK1,024 store the reset flags, when the last block selection control signal $\phi_{BCS}$ goes to the logic "low" state, the erase verification signal ERAvf becomes the logic "low" state by the operations of the NAND gates 212 and 214, short pulse generator 215, flip-flop 207 and inverter 208, and thereby the block address clock $\phi_{BAC}$ also becomes the logic "low" state. As there occurs no failed memory block in step 273 of FIG. 12, all the operations end in step 275. Hence, when all the memory cells within the selected memory block are successfully erased, the pass/fail signal PFreg maintains the logic "high" state in the block erase verification operation.

Figure 13D:
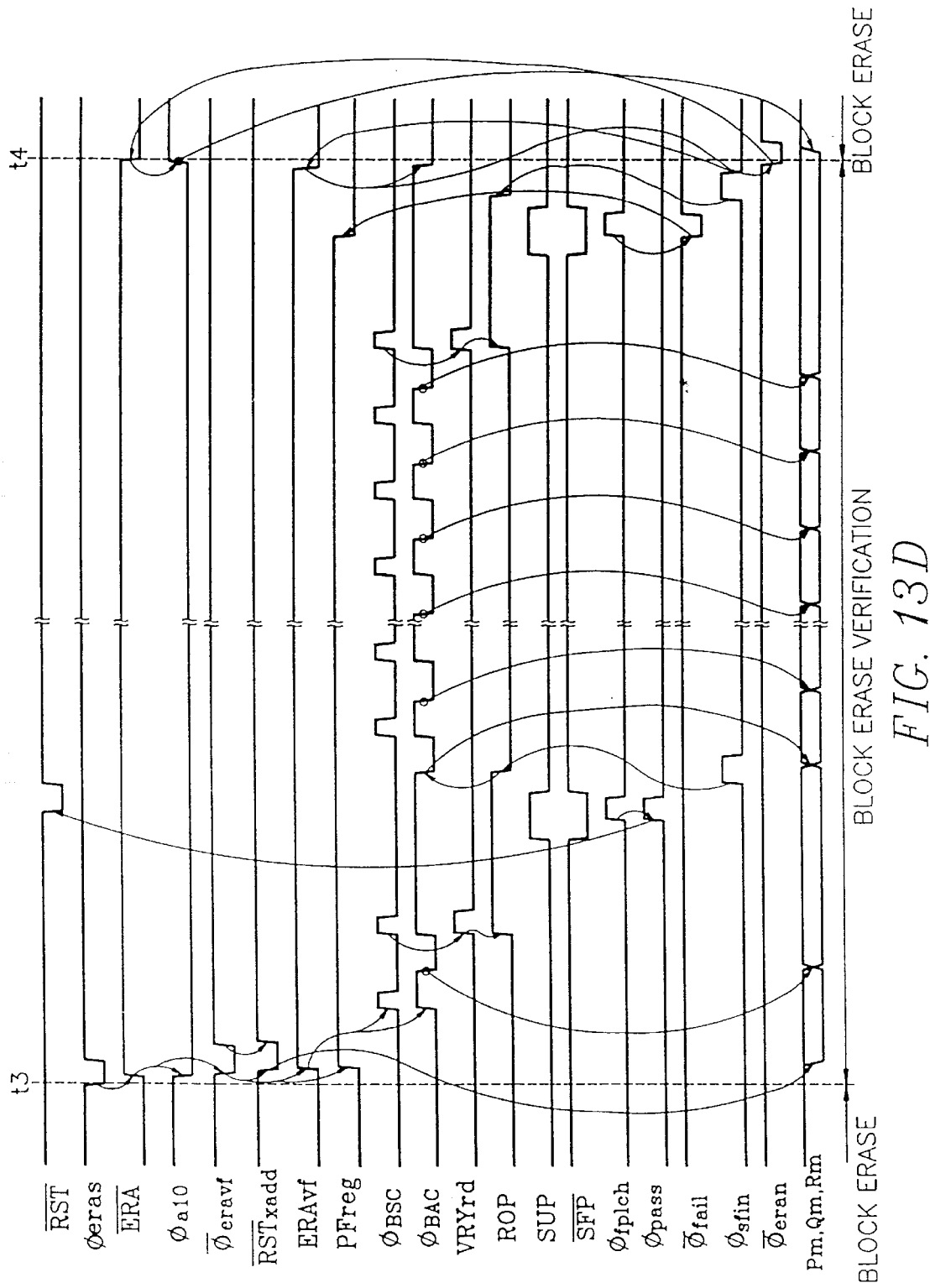

FIG. 13D shows a timing diagram of the first erase verification mode after the multi-block selection mode and first multi-block erase mode, showing that the memory block is erased in the second memory block erase verification operation and the memory cells in the last memory block are not successfully erased.

In case of the erase verification operation for the memory cells within the last memory block BK1,024, the pass/fail detector 110 generates the pass/fail signal of logic "low" state in response to the fail signal $\overline{\phi}_{fail}$ of logic "low" state. Thereafter, in response to the verification read end signal $\overline{\phi}_{sfin}$ of logic "high" state, the flip-flop 191 of FIG. 9 is latched to the logic "high" state and the signal ROP becomes the logic "low" state through the inverter 192. As the predecoding signals $P_7$, $Q_7$ and $R_{15}$ designating the last memory block become the logic "high" state and the verification read end signal $\overline{\phi}_{sfin}$ goes from the logic "high" state to the logic "low" state, the output of the NAND gate 213 goes from the logic "low" state to the logic "high" state, and thereby the output of the NAND gate 214 becomes the logic "low" state.

Hence, the short pulse generator 215 generates the short pulse of logic "high" state and thereby the flip-flop 207 is latched to the logic "high" state. The erase verification signal ERAvf becomes the logic "low" state and thereby the block address clock $\phi_{BAC}$ becomes the logic "low" state. In response to the erase verification signal ERAvf of logic "low" state, the circuit 187 of FIG. 8 generates the erase verification end signal $\phi_{eran}$ of logic "low" state on the line 186. Thus, the counter holding signal $\phi_{a10}$ becomes the logic "high" state and the next multi-block erase operation is performed after the time t4.

Figure 13E:
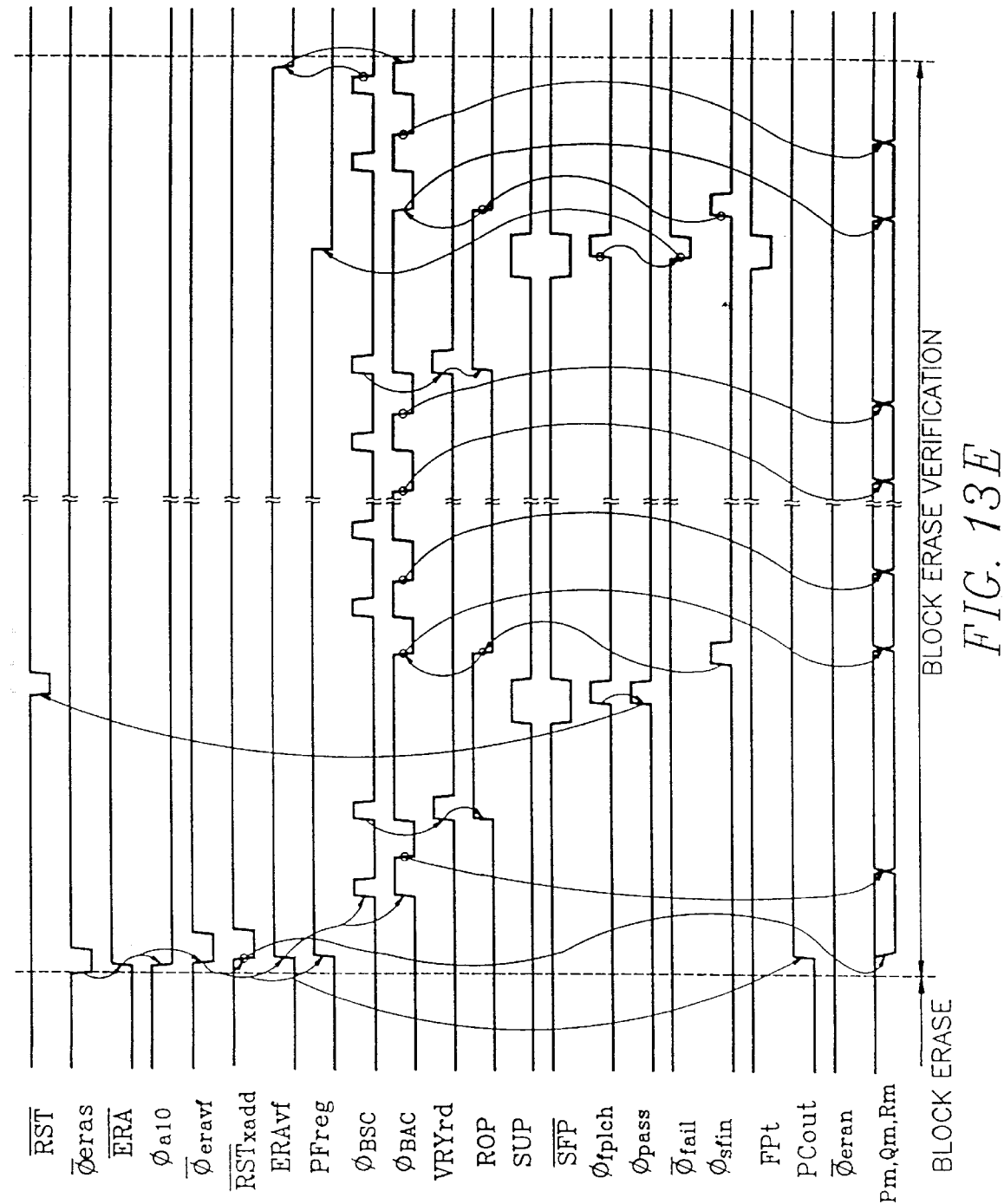

FIG. 13E is the timing diagram showing the block erase verification operation when the loop counter reaches the maximum loop frequency LPmax. In response to the erase verification start signal $\overline{\phi}_{eravf}$ which goes to the logic "low" state, the loop counter 120 generates the loop counter output signal PCout which goes to the logic "high" state. The block erase verification operation for the memory block BK1,022 is performed, and the fail signal $\overline{\phi}_{fail}$ of logic "low" state is generated. Thus, the pass/fail signal becomes the logic "low" state. The block erase verification operation for the last memory block BK1,024 is not performed, the erase verification signal ERAvf becomes the logic "low" state by the block selection control signal $\overline{\phi}_{BSC}$ of logic "low" state, and thereby the block address clock $\phi_{BAC}$ becomes the logic "low" state. As the loop frequency LP reaches the maximum loop frequency at step 274 of FIG. 12, all the operations end in step 276.

The present invention relates to the nonvolatile semiconductor memory device having NAND structured cells, however, this can be also applied to the nonvolatile semiconductor memory device having other structured cells.

In addition, the description has been made with reference to the memory blocks sharing the word line, however, it should be noted that the present invention is not limited thereto. In the case that respective memory blocks do not use the shared word lines, the memory array of FIG. 1 is composed of 2,048 memory blocks. The word lines and the second selection line coupled to the gates of the second selection transistors within each memory block are respectively connected to the control gate lines CGL1 to CGL8 and the ground selection line through the block selection transfer gates. Additionally, in the block selector 60 of FIG. 6, instead of the upper and lower selection gate lines USGLi and LSGLi coupled to the line 61, the selection gate line SGLi connected to the line 61 through the D type transistor (the gate thereof is coupled to $\overline{WEm}$) may be used. The selection gate line SGLi is connected to the first selection line coupled to the gates of the first selection transistors of each memory block.

According to the preferred embodiment of the present invention, the description has been made on the application of the erase voltage to the semiconductor substrate, i.e., the well region 114 during the erase operation, however, it should be noted that the erase voltage can be also applied to the word line of the selected memory block and that the reference voltage can be applied to the sources or drains of the memory transistors within the selected memory block.

As described above, the present invention is capable of storing the block selection flag at the storing means within the block selector related to the selected memory block, and the reset flag at the storing means within the block selector related to the remaining unselected memory blocks during the block selection operation, and of erasing simultaneously the memory transistors within the memory blocks related to the storing means which stores the block selection flag during the block erase operation, making it possible to erase the memory transistors at a shorter time. In addition, the erase verification is performed only for the memory block corresponding to the storing means which stores the block selection flag, this results in reducing the erase verification time. In the case that all of the memory transistors within the selected memory block are successfully erased, the storing means corresponding to the selected memory block stores the reset flag. Therefore, the present invention is advantageous in that it is capable reducing the erase verification time during the block erase and erase verification operations and of enhancing the reliability of the chip.

What is claimed is:

1. In a nonvolatile semiconductor memory device for use in erase verification comprising a memory cell array having a plurality of memory cells arranged in a matrix form of columns and rows, each memory cell including at least one memory transistor with a floating gate and a control gate, said memory cell array being divided into a plurality of memory blocks in a row direction, a plurality of bit lines connected to one end of each of said memory cells arranged in said row direction, a plurality of block selectors connected to said control gates in said memory cells of each memory block to select said memory block, an erase verification circuit connected to said plurality of bit lines, for verifying whether or not said memory cells within said memory block are successfully erased, characterized in that each of said block selectors comprises storing means for storing a reset flag in response to a reset signal and a block selection flag in response to block selection address signals, and judging means for generating an erase verification read signal when said storing means corresponding to the memory block designated by said block selection address signals stores said block selection flag during an erase verification operation, thereby performing said erase verification operation only for the memory block corresponding to the block selector generating said erase verification read signal.

2. The nonvolatile semiconductor memory device according to claim 1, further comprising an address counter for sequentially generating said block selection address signals during said erase verification operation.

3. The nonvolatile semiconductor memory device according to claim 2, further comprising means for changing said block selection flag stored at corresponding storing means to said reset flag when said memory transistors within the memory block selected by said block selection address signals are successfully erased, during said erase verification operation.

4. The nonvolatile semiconductor memory device according to claim 3, further comprising control means for repeating block erase and erase verification operations after said erase verification operation until all of said memory transistors within said selected memory block are successfully erased.

5. The nonvolatile semiconductor memory device according to claim 4, further comprising a loop counter for designating a maximum loop repetition frequency.

6. A multi-block erase and verification method of a nonvolatile semiconductor memory device having a plurality of memory blocks composed of a plurality of memory cells formed on a semiconductor substrate, each memory cell including at least one memory transistor with a floating gate and a control gate, said control gates of said memory transistors within each memory block connected to at least one word line, and having a plurality of block selectors connected to said plurality of memory blocks, each block selector having storing means for selecting said word line of said memory block, said method comprising the steps of:

storing a reset flag at said storing means;

storing a block selection flag at said storing means corresponding to at least one selected memory block;

during a multi-block erase operation, applying erase voltage to said semiconductor substrate, reference voltage to the word line related to said selected memory block in response to said block selection flag stored in said selected memory block, and floating the word lines related to the unselected memory blocks in response to said reset flag stored in said remaining unselected memory blocks; and during a block erase verification operation after said multi-block erase operation, changing said block selection flag stored at said storing means related to said selected memory block to said reset flag when all the memory transistors within said selected memory block are successfully erased.

7. The multi-block erase and verification method according to claim 6, wherein said erase and erase verification operations are repeatedly performed after said block erase verification operation.

* * * * *